(12) United States Patent
Takashima

(10) Patent No.: US 8,218,372 B2
(45) Date of Patent: Jul. 10, 2012

(54) SEMICONDUCTOR STORAGE DEVICE

(75) Inventor: Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 38 days.

(21) Appl. No.: 12/877,862

(22) Filed: Sep. 8, 2010

(65) Prior Publication Data

US 2011/0058428 A1    Mar. 10, 2011

(30) Foreign Application Priority Data

Sep. 8, 2009   (JP) ................................. 2009-207300

(51) Int. Cl.
*G11C 11/34* (2006.01)

(52) U.S. Cl. .... 365/188; 365/187; 365/149; 365/189.04

(58) Field of Classification Search .................. 365/188, 365/187, 149, 148, 189.04
See application file for complete search history.

(56) References Cited

U.S. PATENT DOCUMENTS

| | | | |
|---|---|---|---|
| 7,468,925 B2 | 12/2008 | Kurumada | |
| 2009/0168496 A1* | 7/2009 | Mikan et al. | 365/154 |

FOREIGN PATENT DOCUMENTS

| | | |
|---|---|---|
| JP | 2005-025859 | 1/2005 |
| JP | 2006-286100 | 10/2006 |
| WO | WO 2007/088615 | 8/2007 |

OTHER PUBLICATIONS

Chang et al., "Stable SRAM Cell Design for the 32 nm Node and Beyond," Jun. 2005 Symposium on VLSI Technology Digest of Technical Papers, pp. 128-129 with Background Art Information.
Pavlov et al., "CMOS SRAM Circuit Design and Parametric Test in Nano-Scaled Technologies," Springer ISBN 978-1-4020-8362-4, vol. 40, pp. 16-21, 2008 with Prior Art Information List.
Japanese Office Action dated Sep. 27, 2011 for Japanese Application No. 2009-207300.

\* cited by examiner

*Primary Examiner* — Thong Q Le
(74) *Attorney, Agent, or Firm* — Knobbe, Martens, Olson & Bear, LLP

(57) ABSTRACT

According to one embodiment, a first node is connected to a gate of a second PMOS and a gate of a second NMOS, a second node is connected to a gate of a first PMOS and a gate of a first NMOS, a gate of the first transistor is connected to a first signal line, a source of a first transistor is connected to the first node, and a drain of the first transistor is connected to the second node, a gate of a second transistor is connected to the second node, a source of the second transistor is connected to a third node, and a drain of the second transistor is connected to a second signal line, and a gate of a third transistor is connected to a third signal line, a source of the third transistor is connected to a fourth signal line, and a drain of the third transistor is connected to the third node.

22 Claims, 17 Drawing Sheets

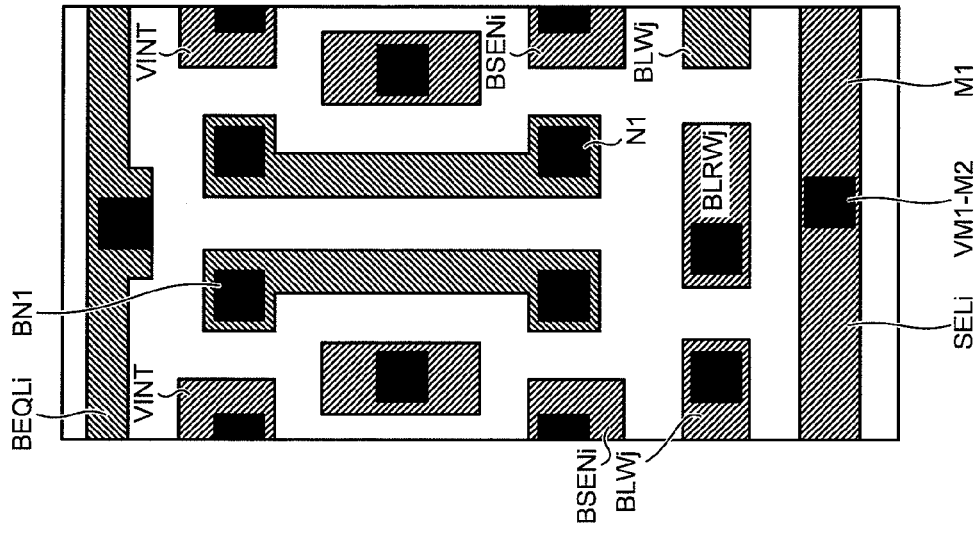
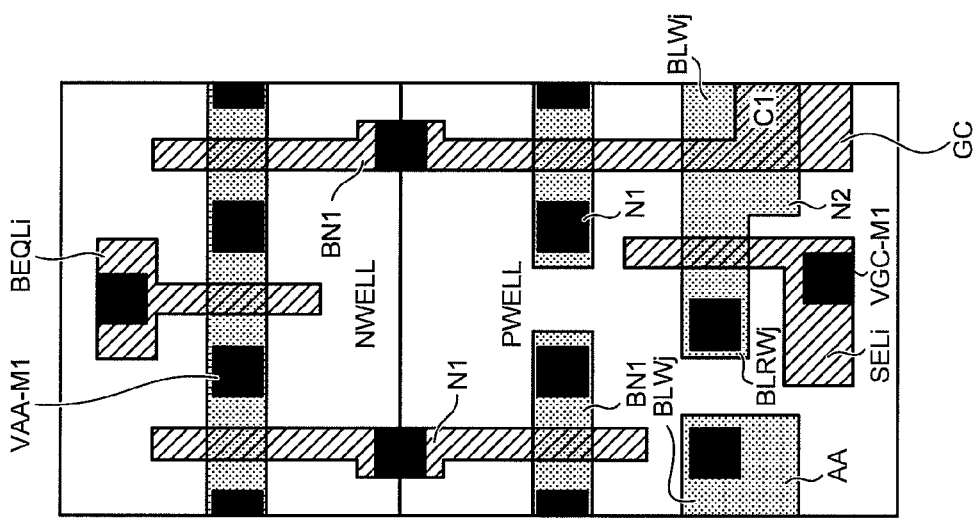
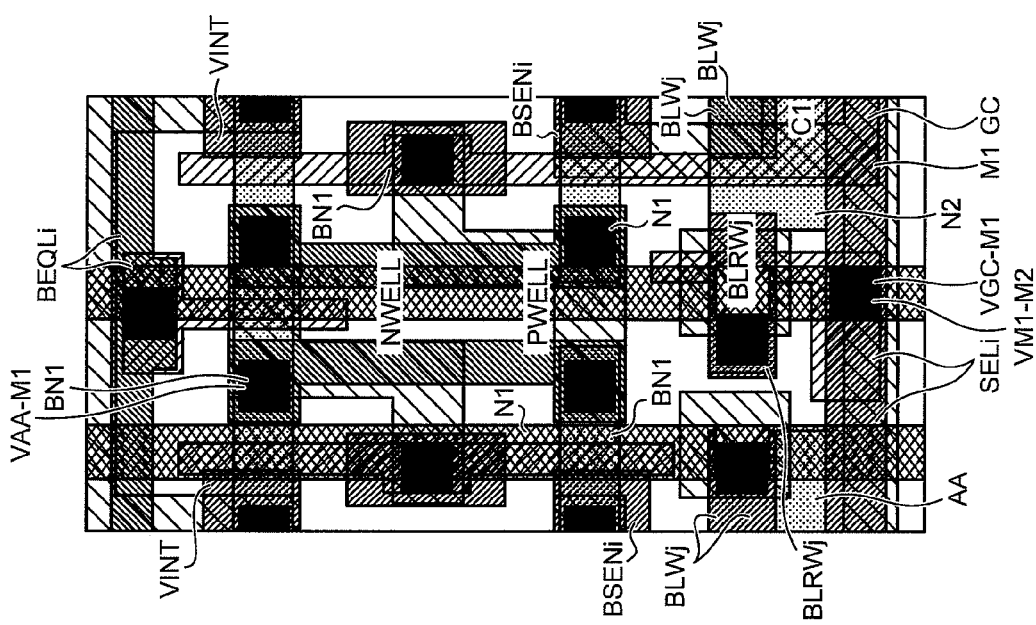

FIG.8A
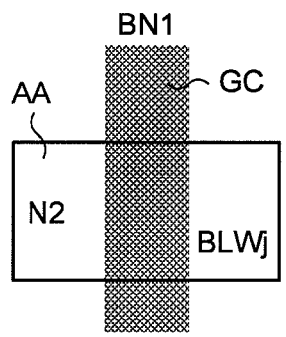
FIG.8B
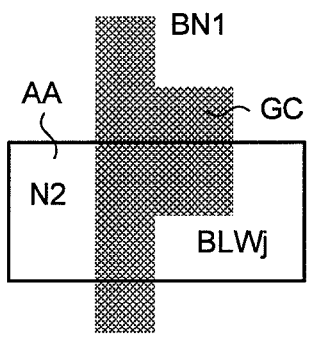
FIG.8C
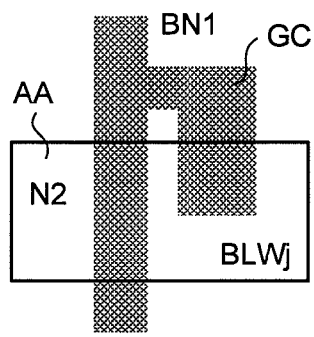
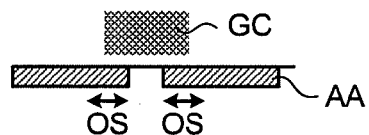
FIG.8D
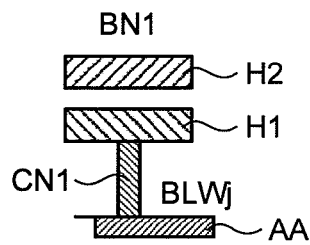
FIG.9
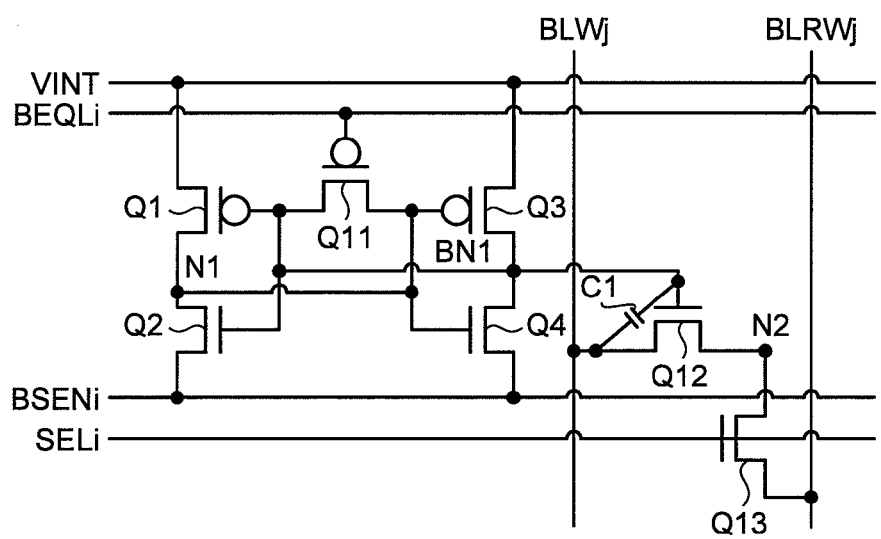

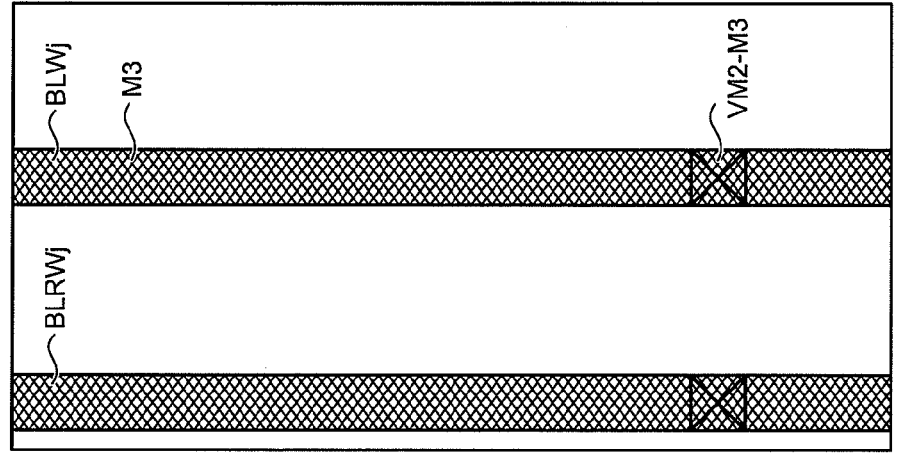
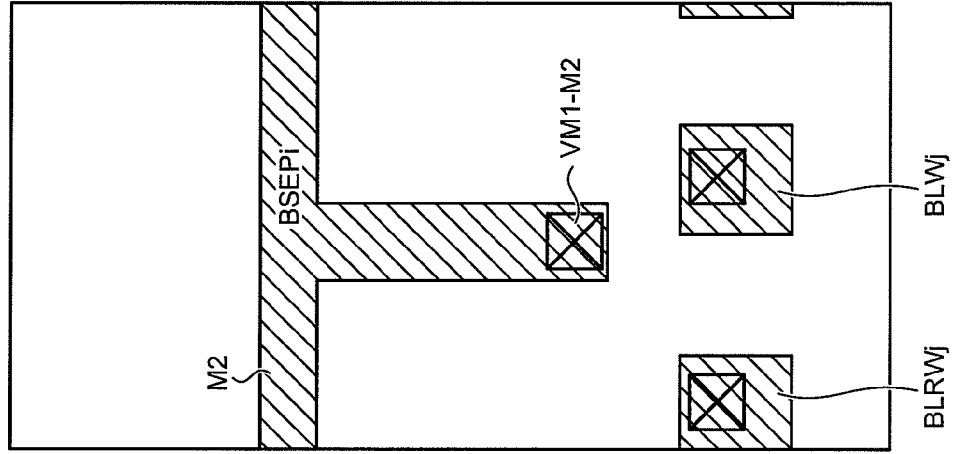
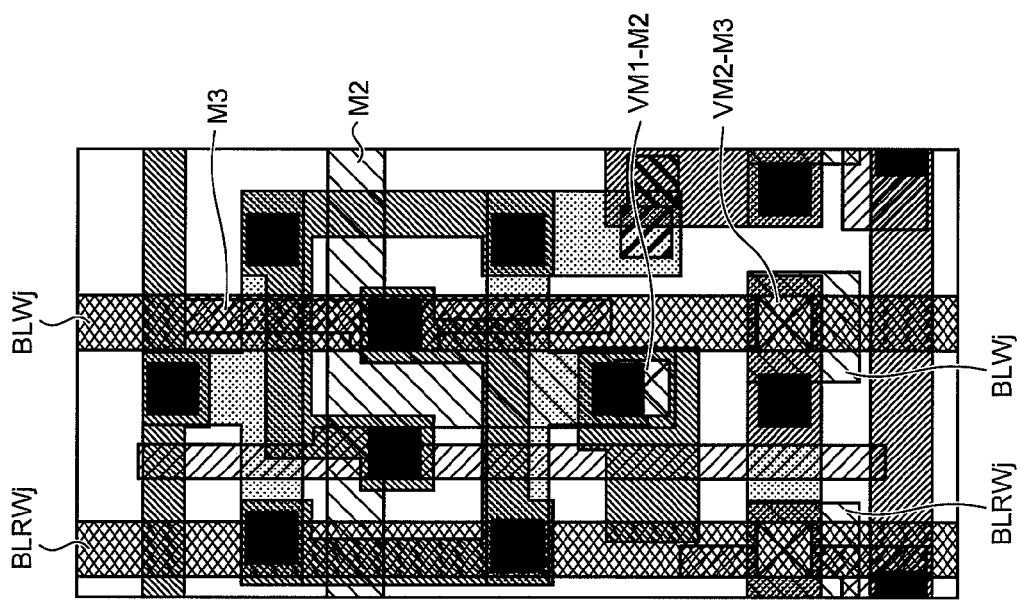

SEMICONDUCTOR STORAGE DEVICE

CROSS-REFERENCE TO RELATED APPLICATIONS

This application is based upon and claims the benefit of priority from the prior Japanese Patent Application No. 2009-207300, filed on Sep. 8, 2009; the entire contents of which are incorporated herein by reference.

FIELD

Embodiments described herein relate generally to a semiconductor storage device.

BACKGROUND

Nowadays, semiconductor memories are used in various applications such as a main storage of a large computer, a personal computer, home appliances, and a cellular phone. As types of the semiconductor memories, a volatile dynamic random access memory (DRAM), a static random access memory (SRAM), a nonvolatile mask read only memory (Mask ROM), a flash electrically erasable programmable read only memory (EEPROM) (NAND-flash memory or NOR-flash memory), and the like are on the market. In particular, the SRAM can be manufactured in a standard Si process and is incorporated in nearly all system LSIs, although there is a slight difference in the inside.

In the SRAM, in general, one memory cell that stores 1-bit information includes six transistors in total. A PMOS transistor and an NMOS transistor are connected in series to each other to form a CMOS inverter. Outputs and inputs of a pair of the CMOS inverters are cross-coupled to each other to form a flip-flop (Andrei Pavlov et al., "CMOS SRAM Circuit Design and Parametric Test in Nano-Scaled Technologies", Springer, ISBN 978-1-4020-8362-4).

In this memory cell, contrary relations are required for driving forces of the transistors during readout and during writing. This causes an increase in cell size. Further, compared with a normal logic circuit, an operation margin of the memory cell is small. When the memory cell is caused to perform a low-voltage operation, in some case, the memory cell malfunctions.

To solve such problems, there is proposed a system for adding two read-only transistors and forming a memory cell with eight transistors in total (Leland Chang et al., "Stable SRAM Cell Design for 32 nm Node Beyond," VLSI Technology Symposium, pp 128-129, June, 2005). In this memory cell, there is no limitation on driving forces of the transistors during readout and only limitation during writing is applied to the memory cell. Therefore, limitation on the size of cell transistors decreases, the size of the cell transistors can be reduced, the operation margin is improved, and the low-voltage operation can be performed.

BRIEF DESCRIPTION OF THE DRAWINGS

FIGS. 6A to 6C are plan views of a layout configuration of a semiconductor storage device according to a fourth embodiment of the present invention;

FIGS. 8A to 8D are diagrams of a schematic configuration of a capacitor section of a semiconductor storage device according to a fifth embodiment of the present invention;

FIG. 9 is an equivalent circuit diagram of a schematic configuration of a semiconductor storage device according to a sixth embodiment of the present invention;

FIGS. 25A to 25C are plan views of a layout configuration of the semiconductor storage device according to the twentieth embodiment of the present invention.

DETAILED DESCRIPTION

In general, according to one embodiment, a memory cell that stores 1-bit information includes a first PMOS transistor, a second PMOS transistor, a first NMOS transistor, a second NMOS transistor, a first transistor, a second transistor, and a third transistor. Sources of the first and second PMOS transistors are connected to a first power supply line. A drain of the first PMOS transistor is connected to a first node. A drain of the second PMOS transistor is connected to a second node. Sources of the first and second NMOS transistors are connected to a second power supply line. A drain of the first NMOS transistor is connected to the first node. The first node is connected to a gate of the second PMOS transistor and a gate of the second NMOS transistor. The second node is connected to a gate of the first PMOS transistor and a gate of the first NMOS transistor. A gate of the first transistor is connected to a first signal line. A source of the first transistor is connected to the first node. A drain of the first transistor is connected to the second node. A gate of the second transistor is connected to the second node. A source of the second transistor is connected to a third node. A drain of the second transistor is connected to a second signal line. A gate of the third transistor is connected to a third signal line. A source of the third transistor is connected to a fourth signal line. A drain of the third transistor is connected to the third node.

Exemplary embodiments of a semiconductor storage device will be explained below in detail with reference to the accompanying drawings. The present invention is not limited to the following embodiments.

Figure 1:
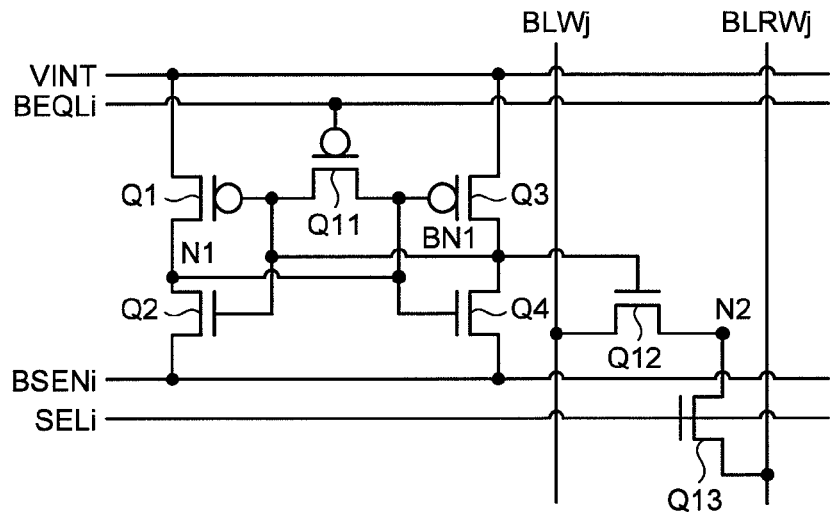
FIG. 1 is an equivalent circuit diagram of a schematic configuration of a semiconductor storage device according to a first embodiment of the present invention.

FIG. 1 is an equivalent circuit diagram of a schematic configuration of a semiconductor storage device according to a first embodiment of the present invention.

In FIG. 1, one memory cell that stores 1-bit information includes seven transistors in total, i.e., PMOS transistors Q1, Q3, and Q11 and NMOS transistors Q2, Q4, Q12, and Q13. A data holding function can be realized by four transistors in total, i.e., the PMOS transistors Q1 and Q3 and the NMOS transistors Q2 and Q4. Specifically, a flip-flop is configured by connecting, as inputs, outputs of an inverter including the PMOS transistor Q1 and the NMOS transistor Q2 and an inverter including the PMOS transistor Q3 and the NMOS transistor Q4. Data can be held as long as voltage is applied between power supply lines VINT and BSENi. In other words, two states can be held, i.e., a state in which a node N1 has the potential of the power supply line VINT and a node BN1 has the potential of the power supply line BSENi and a state in which the node N1 has the potential of the power supply line BSENi and the node BN1 has the potential of the power supply line VINT.

A readout function can be realized by connecting, in series, the NMOS transistor Q12 that receives the potential of the node BN1 as a gate input and the NMOS transistor Q13 that receives the potential of a row selection line SELi, which performs row selection, as an input and connecting the NMOS transistor Q12 and the NMOS transistor Q13 to two bit lines BLWj and BLRWj.

Data of a cell connected to a selected i-th row (i=0-n) among cells connected to the bit lines BLWj and BLRWj (j=0-m) is read out to the bit lines BLWj and BLRWj. For example, the bit line BLWj is fixed at a high level and the bit line BLRWj is set to floating after being set to a low level. When the potential of the row selection line SELi is set to the high level and a cell is selected, the NMOS transistor Q12 is turned on or off according to a state of the node BN1. Therefore, when the NMOS transistor Q12 is on, high-level chargers of the bit line BLWj flow to the bit line BLRWj and the potential of the bit line BLRWj rises. When the NMOS transistor Q12 is off, charges do not flow. Therefore, if the potential of the bit line BLRWj is amplified by a sense circuit, discrimination of 0 and 1 data can be performed. At this point, even if the potential of the row selection line SELi is at the low level, because the NMOS transistor Q12 is off, a readout operation is not affected.

In this way, the readout operation can be performed in the same manner as the system for adding two read-only transistors to configure a memory cell with eight transistors in total. During readout, force for driving the potentials of the nodes BN1 and N1 in a cell-data destroying direction does not work and a stable operation can be performed. A ratio of driving forces causes a problem nowhere between the PMOS transistors Q1, Q23, and Q11 and the NMOS transistors Q2, Q4, Q12, and Q13. The size of the cell transistors can be reduced to a minimum design rule. Further, because the ratio of driving forces does not affect the cell transistors, resistance of the cell transistors against fluctuation increases, a margin characteristic is remarkably improved, and a low-voltage operation can be performed.

In a writing operation, because no transistor is connected between the bit lines BLWj and BLRWj and the nodes N1 and BN1, a problem of a ratio of writing driving forces do not occur. This basic operation is performed by making use of parasitic capacitance Cx among a source, a drain, a channel, and a gate of a node of the NMOS transistor Q12 for readout. Writing is performed by raising or lowering the potential of the node BN1 through coupling by the parasitic capacitance Cx at the time when the potential of the node N2 between the bit lines BLWj and BLRWj, i.e., the NMOS transistors Q12 and Q13 is simultaneously raised from the low level to the high level or when the potential of the node N2 is lowered from the high level to the low level.

Actually, when any one of the PMOS transistors Q1 and Q3 and the NMOS transistors Q2 and Q4 is on, the potential of the node BN1 raised or lowered by the coupling is reset. Therefore, writing is performed by an operation explained below.

First, to perform row selection, the potential of the row selection line SELi is set to the high level.

Second, to turn off the PMOS transistors Q1 and Q3 and the NMOS transistors Q2 and Q4, the potential of the power supply line BSENi connected to sources of the NMOS transistors Q2 and Q4 is raised to the potential of the power supply line VINT connected to sources of the PMOS transistors Q1 and Q3.

Third, when the second state is kept, because charges of initial storage are present in the nodes N1 and BN1, the nodes N1 and BN1 do not have the same potential or it takes time for the nodes N1 and BN1 to have the same potential. Therefore, to set the nodes N1 and BN1 to the same potential, the potential of the equalize line BEQLi is set to the low level, the PMOS transistor Q11 is turned on, and the potentials of the nodes N1 and BN1 are equalized.

Fourth, after the potentials of the nodes N1 and BN1 are equalized, the potential of the equalize line BEQLi is reset to the high level, the PMOS transistor Q11 is turned off, and the nodes N1 and BN1 are set to floating while the potentials of the nodes N1 and BN1 are maintained the same.

Fifth, the bit lines BLWj and BLRWj are simultaneously set from the low level to the high level or from the high level to the low level and the potential of the node BN1 is raised or lowered by coupling of the capacitance Cx with the side of the gate, the source, the drain, and the channel of the NMOS transistor Q12.

Sixth, the potential of the power supply line BSENi is reset from the potential of the power supply line VINT to the potential of a power supply line VSS, whereby a potential difference between the nodes N1 and BN1 caused by the coupling is amplified by a sense amplifier circuit of a flip-flop type until the potential of the node N1 changes to the potential of the power supply line VSS and the potential of the node BN1 changes to the potential of the power supply line VINT or the potential of the node N1 changes to the potential of the power supply line VINT and the potential of the node BN1 changes to the potential of the power supply line VSS. In this way, cell data is held.

Seventh, when the potential of the row selection line SELi is set to the low level to release the row selection, the writing operation ends.

In the series of operations, in a state without the influence on cell data, i.e., the potentials of the power supply line BSENi and the equalize line BEQLi are the potential of the power supply line VSS, writing data is captured in advance and set as data opposite to original writing data. After the nodes BN1 and N1 change to a floating state of the same potential, the data is reset to the original writing data. Then, data can be written in a memory cell. In other words, when the potentials of the power supply line BSENi and the equalize line BEQLi are the potential of the power supply line VSS, even if the bit lines BLWj and BLRWj are caused to operate, a signal is received as only noise. The potentials of the nodes BN1 and N1 can be immediately recovered to the potential of the power supply line VSS or the potential of the power supply line VINT by a signal recovering function of the flip-flop including the MOS transistors Q1 and Q3 and the NMOS transistors Q2 and Q4.

A writable condition is that, when a maximum Vt fluctuation amount in a cell>capacitance Cx/Cn (=entire parasitic capacitance of the node BN1)×the voltage of the power supply line VINT and the voltage of the power supply line. VINT is 1.5V, if Cx/Cn is equal to or larger than 0.2, Vt fluctuation is smaller than 0.3 volt. If the voltage of the power supply line VINT is 1 volt, Cx/Cn=0.3.

The entire parasitic capacitance of the node BN1=(source-to-gate capacitance of the PMOS transistor Q3 and the NMOS transistor Q4, source-to-substrate capacitance, gate-to-other capacitance of the PMOS transistor Q1 and the NMOS transistor Q2, gate-to-source capacitance of the PMOS transistor Q11, wiring capacitance, and gate-to-other capacitance of the NMOS transistor Q12). A ratio of a total of gate-to-other capacitances of the NMOS transistor Q12 to the entire parasitic capacitance is Cx/Cn. In terms of the number of elements, the ratio is ⅙. However, because only the NMOS transistor Q12 is caused to operate in the ON state, reverse channel capacitance is also added and the ratio increases to a certain degree of capacitance ratio. For a stable operation, parasitic capacitance can be intentionally added between the bit line BLWj and the node BN1.

Summarizing the above, in this embodiment, in the readout operation, the operation margin of the cell is not deteriorated because the NMOS transistor Q12 is used. In the writing operation, the problem of the driving force ratio does not occur and the operation margin is not deteriorated because the capacitance coupling is used. Therefore, it is possible to reduce the number of elements to be smaller than that of the SRAM having the eight transistor configuration and reduce the cell size.

On the other hand, in this embodiment, it is necessary to set a potential difference equal to or larger than threshold fluctuation of a cell transistor pair in the capacitance coupling. However, if a ratio of capacitance for causing coupling to capacitance of the entire node BN1 is set to be equal to or larger than a certain degree (>20%), for example, in 1.5V operation, a potential difference equal to or larger than 1.5V× 20%=300 mV can be set. If threshold fluctuation of the PMOS transistors Q1 and Q3 and the NMOS transistors Q2 and Q4 is equal to or smaller than 300 millivolts, a stable operation can be performed.

Figure 2:
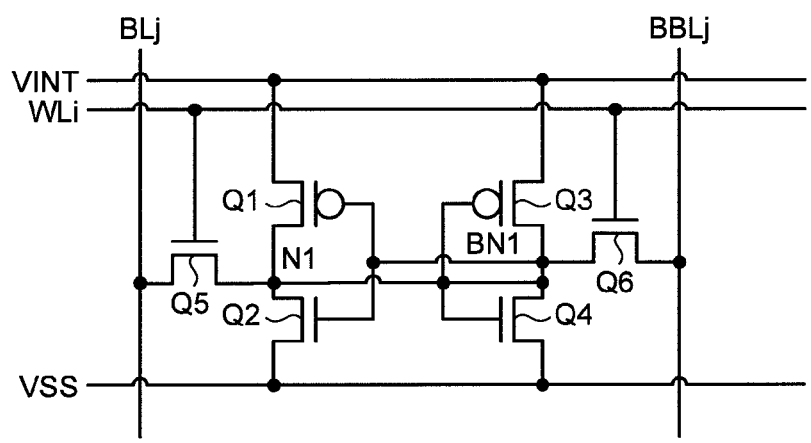
FIG. 2 is an equivalent circuit diagram of an example of a comparative example of the semiconductor storage device.

FIG. 2 is an equivalent circuit diagram of an example of a comparative example of the semiconductor storage device.

In FIG. 2, one memory cell that store 1-bit information includes six transistors in total, i.e., the PMOS transistors Q1 and Q3 and the NMOS transistors Q2 and Q4 to Q6. The flip-flop is configured by connecting, as inputs, outputs of the inverter including the PMOS transistor Q1 and the NMOS transistor Q2 and the inverter including the PMOS transistor Q3 and the NMOS transistor Q4. Data can be held as long as voltage is applied between the power supply lines VINT and VSS. In other words, two states can be held, i.e., a state in which the node N1 has the potential of the power supply line VINT and the node BN1 has the potential of the power supply line VSS and a state in which the node N1 has the potential of the power supply line VSS and the node BN1 has the potential of the power supply line VINT. Data readout and writing are performed via bit lines BLj and BBLj with the potential of a word line WLi raised to the potential of the power supply line VINT.

Specifically, during the readout, after the bit lines BLj and BBLj are pre-charged to the potential of the power supply line VINT, the potential of the word line WLi is raised to the potential of the power supply line VINT. When the potential of the node N1 is the potential of the power supply line VINT and the potential of the node BN1 is the potential of the power supply line VSS, the potential of the bit line BLj remains at the potential of the power supply line VINT. However, because the NMOS transistor Q6 is on, the potential of the bit line BBLj falls via the NMOS transistor Q6. A potential difference between the bit lines BBLj and BLj is amplified by a differential amplifier and data is read out from the memory to the outside.

At this point, a β ratio=(transistor width W4 of the NMOS transistor Q4)/(transistor width W6 of the NMOS transistor Q6) is a problem. Specifically, if transistor size of the NMOS transistor Q4 is not a sufficiently large (β>1) value compared with transistor size of the NMOS transistor Q6, the potential of the node BN1 rises according to the potential of the bit line BBLj (=the potential of the power supply line VINT) and cell data is destroyed. Conversely, when the β ratio is increased, the size of the NMOS transistor Q4 increases and the cell size increases.

Writing of data in the memory cell is performed by forcibly flip-flopping values of the nodes N1 and BN1 by setting the bit lines BLj and BBLj to the potential of the power supply line VSS and the potential of the power supply line VINT or the potential of the power supply line VINT and the potential of the power supply line VSS to raise the potential of the word line WLi to the potential of the power supply line VINT. For example, when the potential of the node N1 is the potential of the power supply line VINT and the potential of the node BN1 is the potential of the power supply line VSS, the potential of the bit line BLj is changed to the potential of the power supply line VSS and the potential of the bit line BBLj is changed to the potential of the power supply line VINT to reverse the data.

To facilitate the rise of the potential of the node BN1, it is necessary to set the driving force of the NMOS transistor Q6 large compared with the NMOS transistor Q4 that stays on. There is a relation contradictory to the readout operation. When the potential of the node N1 is lowered, the data cannot be written until the driving force of the NMOS transistor Q5 is set large compared with that of the PMOS transistor Q1 that stays on.

Specifically, in terms of driving forces of the transistors, in the readout operation, a relation Q2>Q5 and Q4>Q6 desirably holds. In the writing operation, a relation Q2<Q5, Q4<Q6, Q1<Q5, and Q3<Q6 desirably holds. Therefore, the driving forces of the transistors are in a conflicting relation in the readout operation and the writing operation. The readout operation and the writing operation are not stabilized unless the transistor size is changed in such a manner as Q2>Q5>Q1> and Q4>Q6>Q3. Even if any one of the transistors is set to minimum size, the other transistors are larger than the minimum size and the cell size increases. Further, basically, a tradeoff in the driving forces of the transistors is necessary and there is contradiction between the readout operation and the writing operation. Therefore, compared with the operation of the normal logic circuit, an operation margin is small. When the memory cell is caused to perform low-voltage operation, the memory cell malfunctions or is susceptible to fluctuation in a threshold and driving force of the cell transistors.

Figure 3:
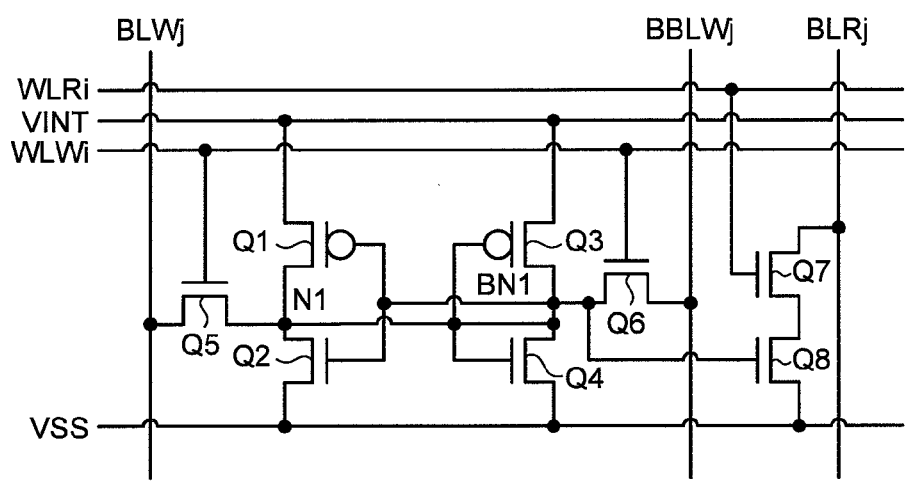
FIG. 3 is an equivalent circuit diagram of another example of the comparative example of the semiconductor storage device.

FIG. 3 is an equivalent circuit diagram of another example of the comparative example of the semiconductor storage device.

In FIG. 3, in the semiconductor storage device, NMOS transistors Q7 and Q8 are added to the configuration shown in FIG. 2. The number of cell transistors that store 1-bit information is eight. In this configuration, the bit lines BLj and BBLj shown in FIG. 2 are write-only bit lines BLWj and BBLWj and the word line WLi shown in FIG. 2 is a write-only word line WLWi. The writing operation is same as that in the configuration shown in FIG. 2, and the best limitation condition is Q2<Q5, Q4<Q6, Q1<Q5, and Q3<Q6.

On the other hand, in the readout operation, there is no limitation on the size of the transistors of the memory cell. When the potential of the node BN1 is gate potential of the NMOS transistor Q8 and the potential of a word line WLRi for readout is raised to the potential of the power supply line VINT, the NMOS transistor Q7 is turned on. When the potential of the node BN1 is the potential of the power supply line VINT, because the NMOS transistors Q7 and Q8 are on, the potential of a read-only bit line BLRj falls. When the potential of the node BN1 is the potential of the power supply line VSS, because the potential of the read-only bit line BLRj stays at the potential of the power supply line VINT, discrimination of readout data can be performed.

In this way, in the configuration shown in FIG. 3, the operation limitation during readout is eliminated and only the limitation during writing is applied. Therefore, the limitation of the size of the cell transistors is reduced, the cell transistor size can be reduced, an operation margin is improved, and a low-voltage operation can be performed.

However, during wiring, the problem of a ratio of the transistors is still present, the size of the respective cell transistors lightly increases, deterioration in the operation margin still occurs, and margin deterioration, deterioration in a low-voltage operation margin, and the like due to fluctuation in the cell transistors occur.

On the other hand, in the embodiment shown in FIG. 1, the margin fall operation and the problem of the driving ratio that spoil a cell stable operation do not occur during readout. During writing, the problems of the margin fall operation and the driving ratio that spoil a cell stable operation do not occur either. Therefore, the low-voltage operation is possible, the size of the cell transistors can be se to the minimum rule, and the cell size can be reduced. In particular, when the cell size is microminiaturized, an unstable operation due to fluctuation in the cell transistors can be prevented. Therefore, a cell-size reduction effect is high. Only limitation is securing of Cx/Cn. However, because Cx/Cn can be naturally secured to some extent, an area penalty is small.

Figure 4:
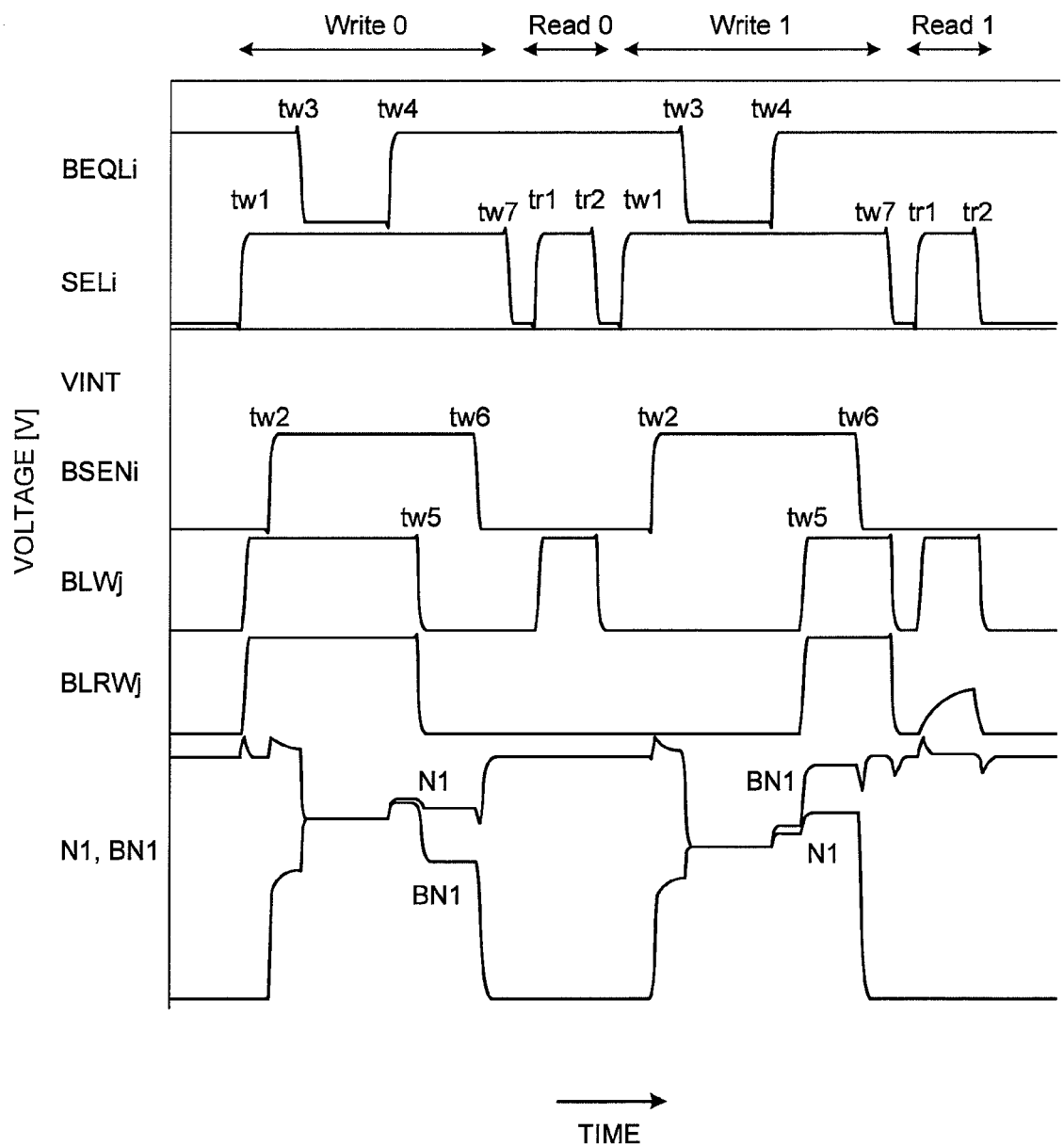
FIG. 4 is a timing chart of operation waveforms of a semiconductor storage device according to a second embodiment of the present invention.

FIG. 4 is a timing chart of operation waveforms of a semiconductor storage device according to a second embodiment of the present invention.

In FIG. 4, this operation is performed by using the configuration shown in FIG. 1. However, the operation can also be applied to other cell configurations. In an operation example shown in FIG. 4, 0 data writing, 0 data readout, 1 data writing, and 1 data readout are performed in order.

First, at timing tw1, to perform row selection, the potential of the row selection line SELi is set to a high level. At the same time, writing data is captured, the writing data is set as 1 data opposite to 0 data of original writing, and the bit lines BLRj and BLRWj are set to the high level. This is for the purpose of writing the 0 data at later timing tw5.

Subsequently, at timing tw2, to turn off the PMOS transistors Q1 and Q3 and the NMOS transistors Q2 and Q4, the potential of the power supply line BSENi connected to the sources of the NMOS transistors Q2 and Q4 is raised to the potential of the power supply line VINT connected to the sources of the PMOS transistors Q1 and Q3. In this state, because charges of initial storage are present in the nodes N1 and BN1, the nodes N1 and BN1 do not have the same potential or it takes time for the nodes N1 and BN1 to have the same potential. Therefore, to set the nodes N1 and BN1 to the same potential, the potential of the equalize line BEQLi is set to a low level, the PMOS transistor Q11 is turned on, and the potentials of the nodes N1 and BN1 are equalized.

At timing tw4, the potential of the equalize line BEQLi is reset to the high level, the PMOS transistor Q11 is turned off, and the potentials of the nodes N1 and BN1 are set to floating while being maintained the same.

At timing tw5, to write the 0 data in a cell, the bit lines BLWj and BLRWj are simultaneously set from the high level to the low level. The potential of the node BN1 is lowered by coupling of the capacitance Cx with the gate, the source, the drain, and the channel side of the NMOS transistor Q12.

At timing tw6, the potential of the power supply line BSENi is reset from the potential of the power supply line VINT to the potential of VSS, whereby a potential difference between the nodes N1 and BN1 caused by the coupling is amplified by a sense amplifier circuit of a flip-flop type until the potential of the node N1 changes to the potential of the power supply line VINT and the potential of the node BN1 changes to the potential of the power supply line VSS. In this way, cell data is held.

At timing tw7, when the potential of the row selection line SELi is set to the low level to release the row selection, the writing operation ends.

As the 0 data readout operation, at timing tr1, the potential of the row selection line SELi is set to the high level and the NMOS transistor Q13 is turned on. At the same time, the bit line BLWj of the bit lines BLRWj and BLWj set to the low level is set to the high level and the bit line BLRWj is set to floating while being kept at the low level. Then, when the potential of the node BN1 is at the low level, because the NMOS transistor Q12 is off and the NMOS transistor Q13 is on, electric current does not flow from the bit line BLWj at the high level to the bit line BLRWj. The potential of the bit line BLRWj remains at the low level. This is detected by a sense amplifier to read out 0 data.

Timing tw1-7 in the case of 1 data writing is the same as the timing in the 0 data writing. The 1 data writing is different from the 0 data writing in that, to write 1 data first, the bit lines BLWj and BLRWj are set to the low level and, during writing, raised to the high level. In the case of the 1 data readout, because the potential of the node BN1 is at the high level, both the NMOS transistors Q12 and Q13 are on, electric current flows from the bit line BLWj at the high level to the bit line BLRWj, and the potential of the bit line BLRWj rises from the low level. This is detected by the sense amplifier to read out 1 data. Effects same as those of the configuration shown in FIG. 1 can be displayed by the operation example shown in FIG. 4.

Figure 5:
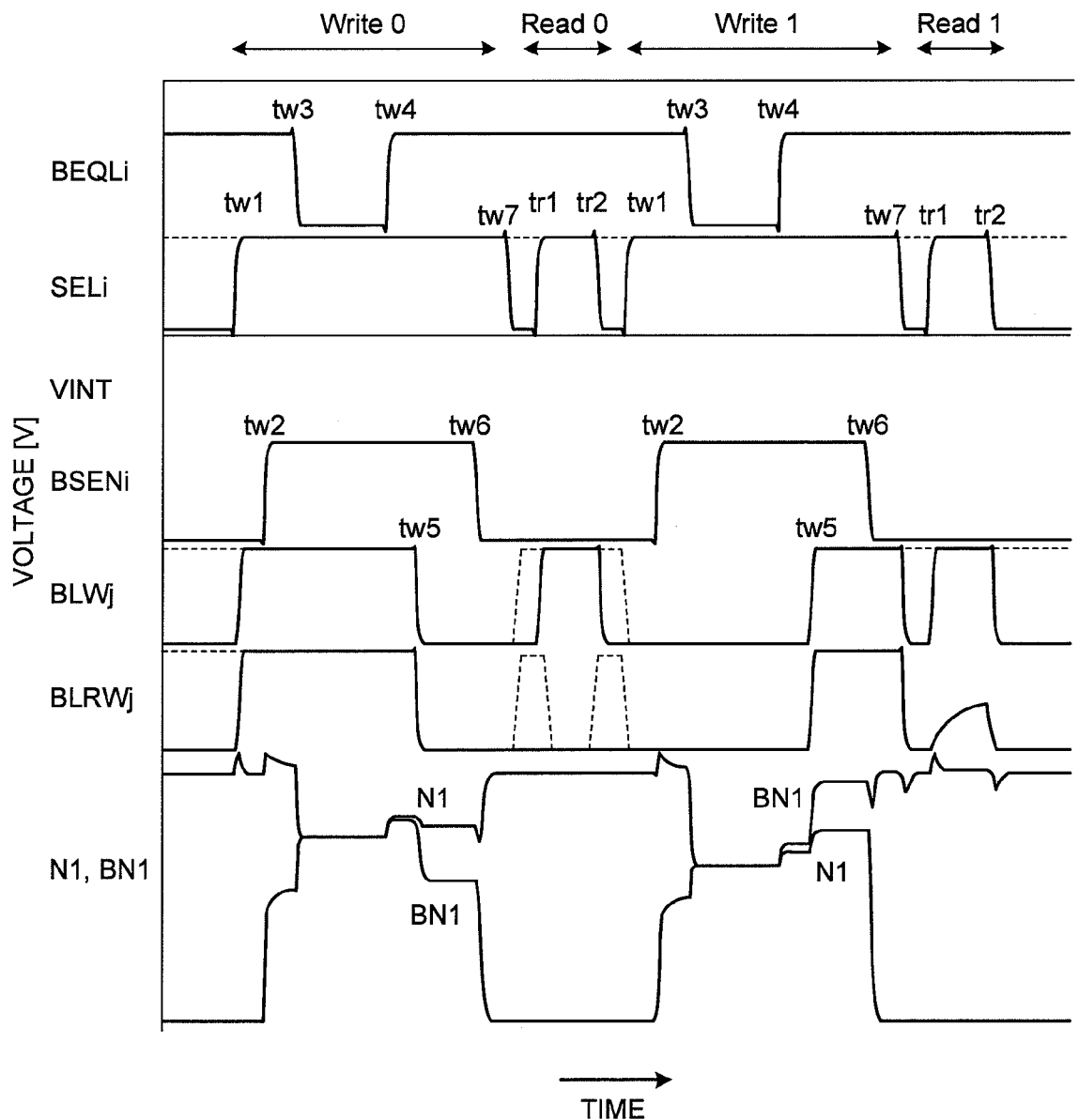
FIG. 5 is a timing chart of operation waveforms of a semiconductor storage device according to a third embodiment of the present invention.

FIG. 5 is a timing chart of operation waveforms of a semiconductor storage device according to a third embodiment of the present invention.

In FIG. 5, this operation is performed by using the configuration shown in FIG. 1. However, the operation can also be applied to other cell configurations. The operation is substantially the same as the operation shown in FIG. 2. Dotted line portions shown in FIG. 2 are changes from FIG. 2. First, when row selection is continuously performed to perform writing or readout, the potential of the row selection line SELi can also be continuously set to the high level.

Second, the potentials of the bit lines BLRWj and BLWj only have to be set to opposite data before writing by coupling of a cell. As indicated by the dotted lines in the figure, if the last operation coincides with the present operation, it is unnecessary to change the potentials of the bit lines BLRWj and BLWj. Even in the readout operation, as long as a rule that the potential of the bit line BLWj is fixed to the high level and the bit line BLRWj is set to floating after being set to the low level is observed, except this period, a voltage setting value can be freely determined, the number of times of amplitude of a bit line signal can be reduced, and timing can be changed. Consequently, unnecessary data transition and control line transition can be eliminated and the speed of operation can be increased.

Further, as a relation between bit lines BLWRj and BLWj, as long as one of the bit lines is at the high level and the other is at the low level and one of the bit lines is floating, the readout operation can be performed. The high level, the low level, and the floating can be freely combined. In this way, in the fifth embodiment, it is possible to realize effects same as those of the operation example shown in FIG. 4 while increasing a degree of freedom of operation and realizing a high-speed operation and a low-power consumption operation.

FIGS. 6A to 6C and FIGS. 7A to 7C are plan views of layout configurations of a semiconductor storage device according to a fourth embodiment of the present invention.

Figure 7C:
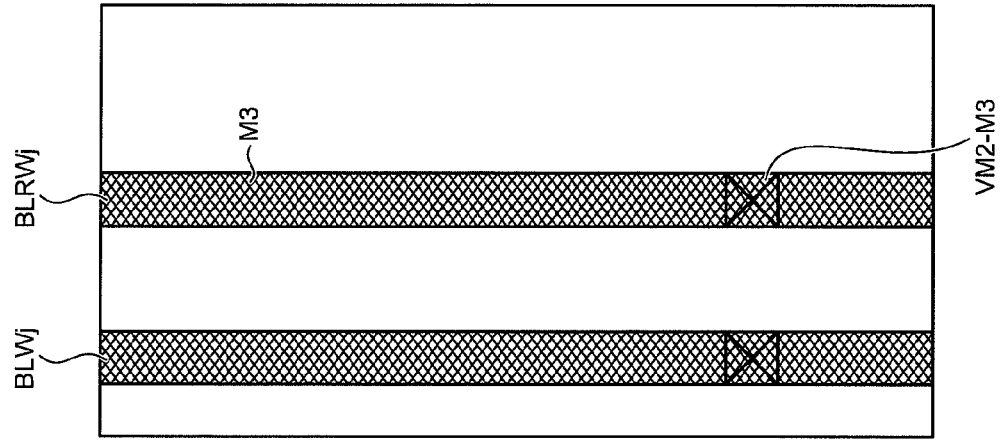
FIGS. 7A to 7C are plan views of a layout configuration of the semiconductor storage device according to the fourth embodiment of the present invention.
Figure 7B:
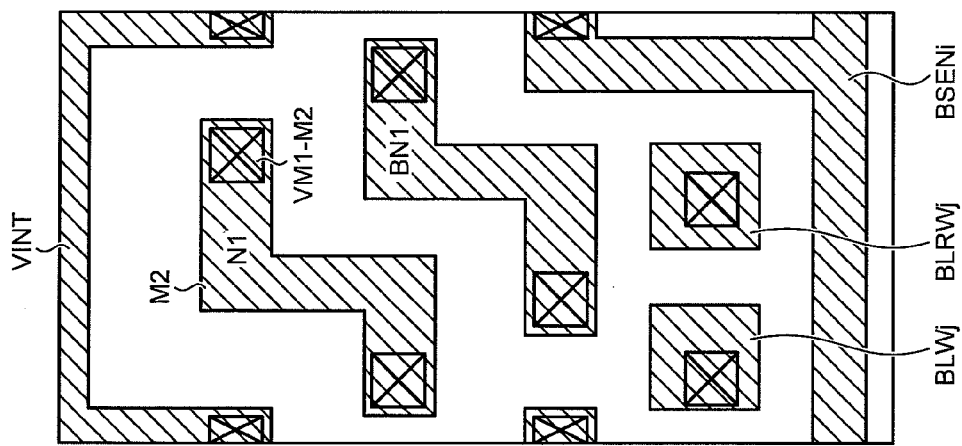
Figure 7A:
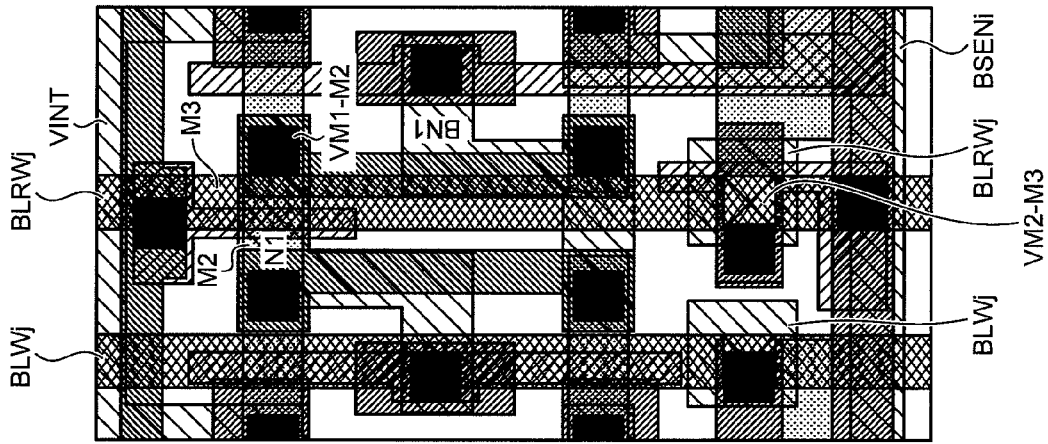

In FIGS. 6A to 6C and FIGS. 7A to 7C, in an example explained in this embodiment, the layout configurations can be applied to the circuit shown in FIG. 1. However, the layout configurations can be applied to other cell configurations. FIGS. 6A and 7A are the same figure. All layout layers are shown while being superimposed one on top of another.

In FIG. 6B, a diffusing layer AA, a gate wiring layer GC, an N well NWELL, a P well PWELL, a contact VAA-M1 between the diffusing layer AA and a metal wire M1, and a contact VGC-M1 between the gate wiring layer GC and the metal wire M1 are shown. The nodes N1 and BN1, the bit lines BLWj and BLRWj, the row selection line SELi, and the equalize line BEQi shown in FIG. 1 are also shown.

In FIG. 6C, the metal wire M1 and a contact VM1-M2 between the metal wires M1 and M2 are shown. The nodes N1 and BN1, the bit lines BLWj and BLWRWj, the row selection line SELi, the equalize line BEQLi, and the power supply lines VINT and BSENi shown in FIG. 1 are also shown.

In FIG. 7B, the metal wire M2 and the contact VM1-M2 between the metal wires M1 and M2 are shown. The nodes N1 and BN1, the bit lines BLWj and BLRWj, and the power supply lines VINT and BSENi shown in FIG. 1 are also shown.

In FIG. 7C, a meal wire M3 and a contact VM2-M3 between the meal wires M2 and M3 are shown. The bit lines BLWj and BLRWj shown in FIG. 1 are also shown.

By using the layouts shown in FIGS. 6A to 6C and FIGS. 7A to 7C, it is possible to display effects same as those of the configuration shown in FIG. 1 while realizing memory cell size same as that of the SRAM shown in FIG. 2. As shown in FIG. 6B, actually, the NMOS transistor Q12 can also adopt a configuration in which a transistor is not only formed at an intersection of the linear diffusing layer AA and the linear gate wire GC but the gate wire GC is thickened to the bit line BLRWj side on a part of the diffusing layer AA.

Consequently, a part of the diffusing layer AA is a transistor between the node N2 and the bit line BLRWj but another part of the diffusing layer AA can be caused to act as parasitic capacitance between the bit line BLRWj and the node BN1 and operation can be stabilized. By thickening the gate wire GC to the bit line BLRWj side on a part of the diffusing layer AA, it is possible to cause a sufficient potential difference equal to or larger than 300 millivolts between the nodes N1 and BN1 with the coupling operation at timing tw5 in FIG. 4 without expanding cell size. Even if there is Vt fluctuation in the transistors of the memory cell, it is possible to stably realize an amplification operation in the cell.

Large capacitance is added between the node BN1 and the bit line BLWj rather than between the nodes BN1 and N2. This is because, when both the potentials of the bit lines BLWj and BLRWj are raised to the potential of the power supply line VINT, because of a fall in the threshold of the NMOS transistor Q13, the potential of the node N2 raises only to potential obtained by subtracting threshold voltage from the potential of the power supply line VINT and a coupling effect on the nodes BN1 and N2 side is weak. However, if the potential of the row selection line SELi connected to the gate of the NMOS transistor Q13 is raised to be equal to or higher than the potential of the power supply line VINT, this problem is solved. Therefore, instead of adding the large capacitance between the node BN1 and the bit line BLWj, the potential of the row selection line SELi can also be raised or capacitance can also be equally added in both of the bit line BLWj and the node N2.

In this way, in this embodiment, a gain transistor for readout can also be used as a coupling transistor for writing.

FIGS. 8A to 8D are diagrams of a schematic configuration of a capacitance section of a semiconductor storage device according to a fifth embodiment of the present invention.

In FIG. 8A, overlap capacitance is increased by increasing overlap amounts OS between the gate and the source and between the gate and the drain of the NMOS transistor Q12 compared with the normal transistor. For example, the channel length of the NMOS transistor Q12 can be set longer than the normal transistor. A diffusing amount and a seeping-out amount in a lateral direction at channel ends of the source and the drain can be increased. This makes it possible to increase parasitic capacitance between the node BN1 and the bit line BLWj and between the nodes BN1 and N2 and perform a stable operation.

In FIG. 8B, as in the configuration shown in FIG. 4, a part of the gate wire GC on the diffusing layer AA is thickened to the bit line BLWj side, whereby capacitance between the node BN1 and the bit line BLWj can be increased. Differences from the configuration shown in FIG. 4 is that, when a driving gate signal is received from above in the figure, the gate wire GC is thickened to the upper side and the bit line BLWj side in FIGS. 6A to 6C and the gate wire GC is thickened to the lower side and the bit line BLWj side.

In FIG. 8C, the position of the gate wire GC of the node BN1 is completely separated for a transistor and for a MOS capacitor.

In FIG. 8D, in addition to the coupling effect of the NMOS transistor Q12, a capacitor element is separately connected between the node BN1 and the bit line BLWj. When a DRAM is mixed, the capacitor element only has to be formed by a cell cap (Trech, Stacked) of the DRAM. When an analog circuit is mixed, the capacitor element only has to be formed by a MIM capacitor. The capacitor element can also be formed by a capacitor between wiring layers H1 and H2 and connected to the diffusing layer AA via a contact CN1.

FIG. 9 is an equivalent circuit diagram of a schematic configuration of a semiconductor storage device according to a sixth embodiment of the present invention.

In FIG. 9, in the semiconductor storage device, in addition to the components shown in FIG. 1, a separate capacitor C1 is provided between the bit line BLWj and the node BN1. As the capacitor C1, the various capacitors shown in FIG. 8D can be used. By providing the capacitor C1, it is possible to improve a capacity ratio and increase stability.

Figure 10:
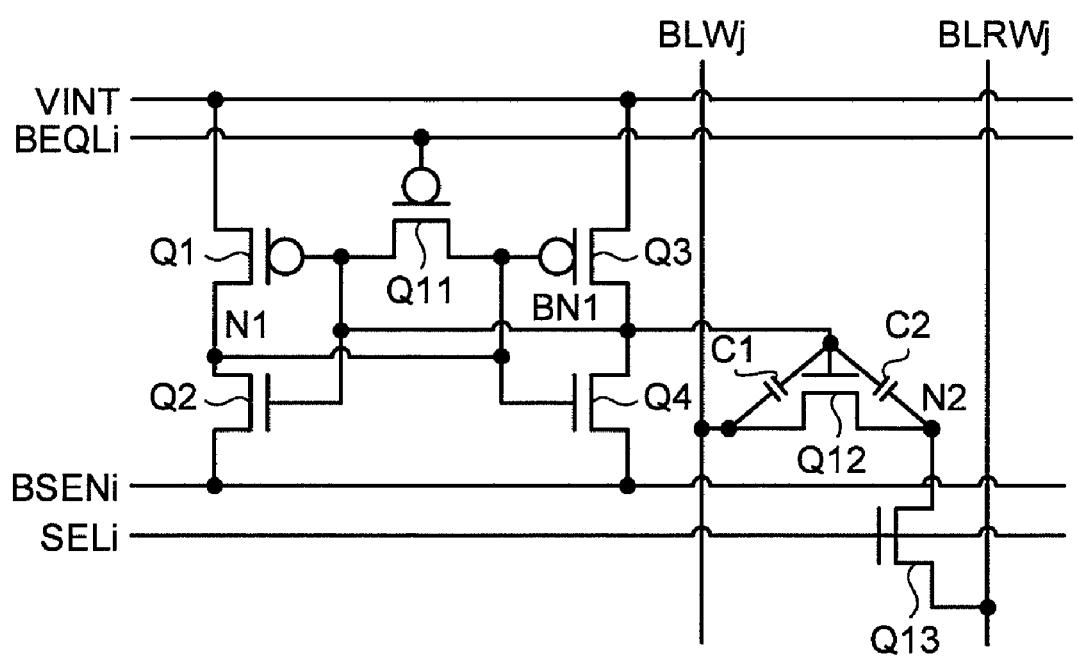
FIG. 10 is an equivalent circuit diagram of a schematic configuration of a semiconductor storage device according to a seventh embodiment of the present invention.

FIG. 10 is an equivalent circuit diagram of a schematic configuration of a semiconductor storage device according to a seventh embodiment of the present invention.

In FIG. 10, in the semiconductor storage device, in addition to the components shown in FIG. 1, the separate capacitor C1 is provided between the bit line BLWj and the node BN1 and a separate capacitor C2 is provided between the node N2 and the node BN1. As the capacitors C1 and C2, the various capacitors shown in FIG. 8D can be used. By providing the capacitors C1 and C2, it is possible to improve a capacity ratio and increase stability.

Figure 11:
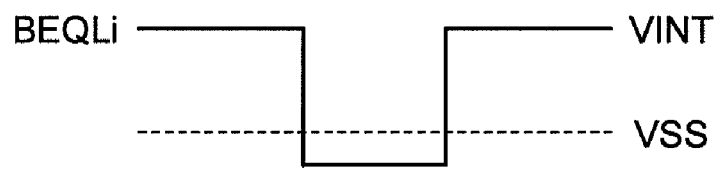
FIG. 11 is a diagram of an operation waveform of a semiconductor storage device according to an eighth embodiment of the present invention.

FIG. 11 is a diagram of an operation waveform of a semiconductor storage device according to an eighth embodiment of the present invention.

In FIG. 11, when the PMOS transistor Q11 shown in FIG. 1 is turned on and the nodes N1 and N2 are equalized, the potential of the equalize line BEQLi is deflected further to a negative voltage than the potential of the power supply line VSS. When the potential of the power supply line BSENi is raised from the potential of the power supply line VSS to the potential of the power supply line VINT before the nodes N1 and BN1 are equalized, for example, if the potential of the node N1 is the potential of the power supply line VINT and the potential of the node BN1 is the potential of the power supply line VSS, the potential of the node BN1 does not rise from the potential of the power supply line VSS to the potential of the power supply line VINT.

When the potential of the power supply line BSENi is raised until the potential between the gate and the source of the NMOS transistor Q4 that stays on falls to be lower than a threshold voltage, the NMOS transistor Q4 is turned off and the potential of the node BN1 is saturated and stops rising at the point of timing tw2 in FIG. 4. Therefore, thereafter, when the potential of the equalize line BEQLi is set to the potential of the power supply line VSS and the nodes BN1 and N1 are equalized, the nodes BN1 and N1 have intermediate potential of the potential of the power supply line VINT and the saturated potential. When the threshold voltage of the PMOS transistor Q11 is high, the equalization is difficult. As another method, an NMOS transistor Q11' only has to be added in addition to the PMOS transistor Q11. However, as shown in FIG. 11, this problem can also be solved by setting the potential of the equalize line BEQLi to negative potential.

Figure 12A:
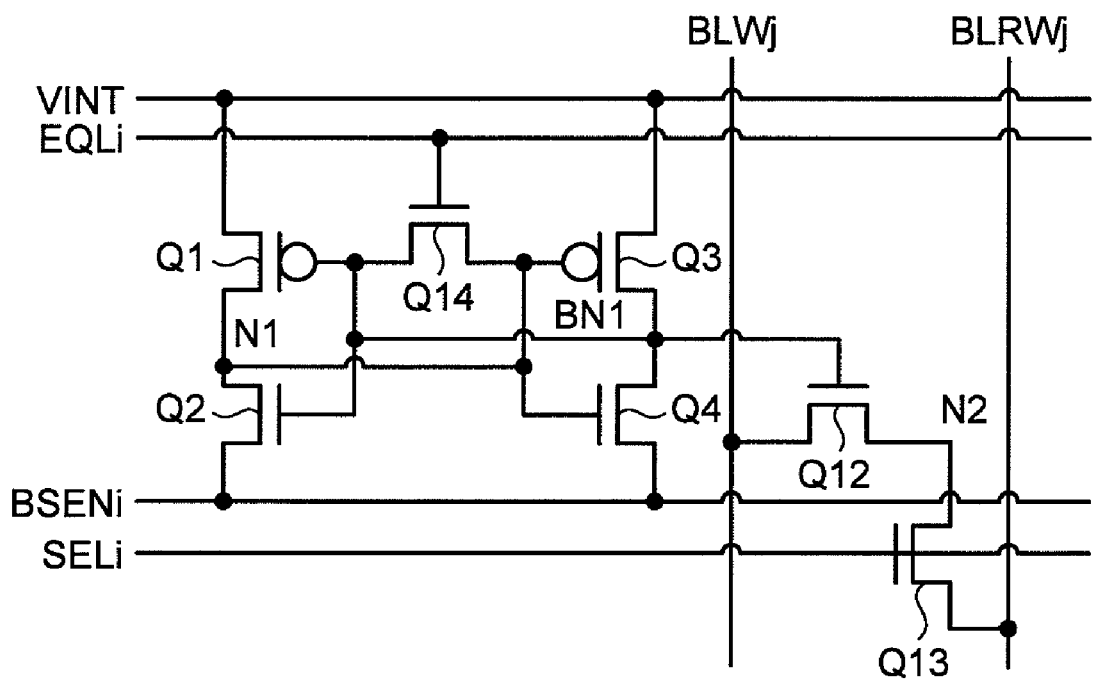
FIG. 12A is an equivalent circuit diagram of a schematic configuration of a semiconductor storage device according to a ninth embodiment of the present invention.

FIG. 12A is an equivalent circuit diagram of a schematic configuration of a semiconductor storage device according to a ninth embodiment of the present invention.

Figure 12B:
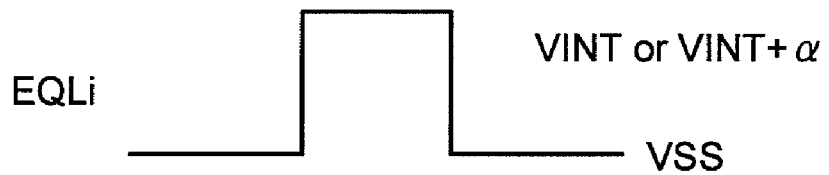
FIG. 12B is a diagram of a waveform of the potential of an equalize line BEQLi.

In FIG. 12A, in the semiconductor storage device, an NMOS transistor Q14 is provided instead of the PMOS transistor Q11 shown in FIG. 1. A gate of the NMOS transistor Q14 is connected to the equalize line EQLi. The polarity of the potential of the equalize line EQLi can be set opposite to the polarity of the potential of the equalize line BEQLi. Further, as shown in FIG. 12B, if the potential of the equalize line EQLi is raised to be equal to or higher than the potential of the power supply line VINT, effects same as those in the embodiment shown in FIG. 11 can be obtained.

Figure 13A:
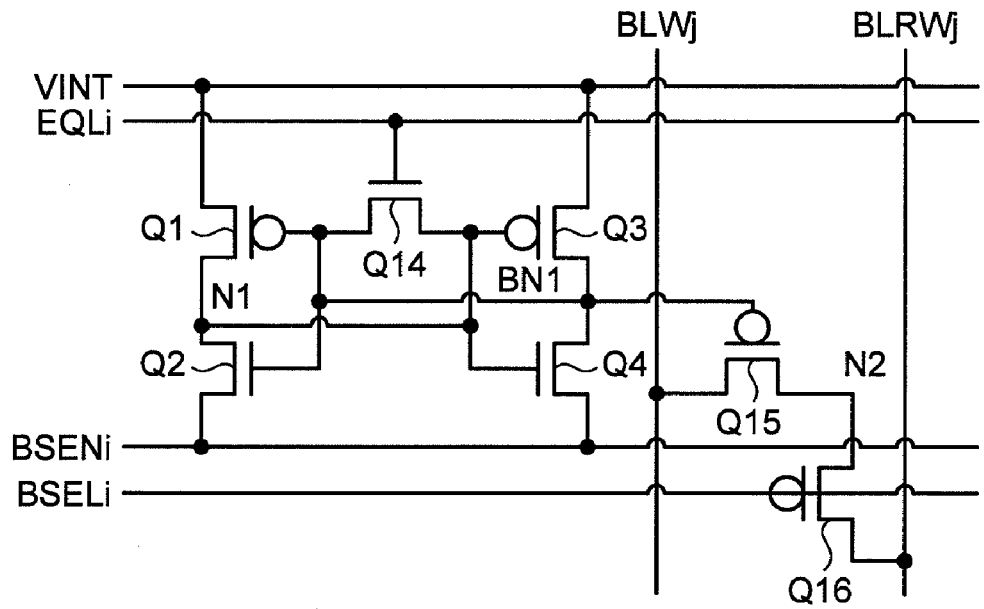
FIG. 13A is an equivalent circuit diagram of a schematic configuration of a semiconductor storage device according to a tenth embodiment of the present invention.
Figure 13B:
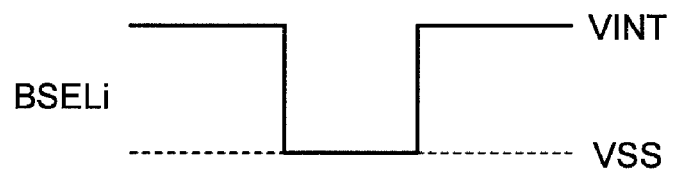
FIG. 13B is a diagram of a waveform of the potential of a row selection line BSELi.

FIGS. 13A and 13B are equivalent circuit diagrams of a schematic configuration of a semiconductor storage device according to a tenth embodiment of the present invention.

In FIG. 13A, in the semiconductor storage device, the NMOS transistor Q14 is provided instead of the PMOS transistor Q11 shown in FIG. 1 and PMOS transistors Q15 and Q16 are provided instead of the NMOS transistors Q12 and Q13 shown in FIG. 1. A gate of the PMOS transistor Q16 is connected to the row selection line BSELi. As shown in FIG. 13B, the polarity of the potential of the row selection line BSELi can be set opposite to the polarity of the potential of the row selection line SELi.

Concerning the transistors other than the PMOS transistors Q1 and Q3 and the NMOS transistors Q2 and Q4 in the embodiment shown in FIG. 1, all combinations of the NMOS transistors and the PMOS transistors can be applied. The polarity of a control signal for controlling the potentials of the gates of the transistors only has to be changed according to the combinations.

Figure 14:
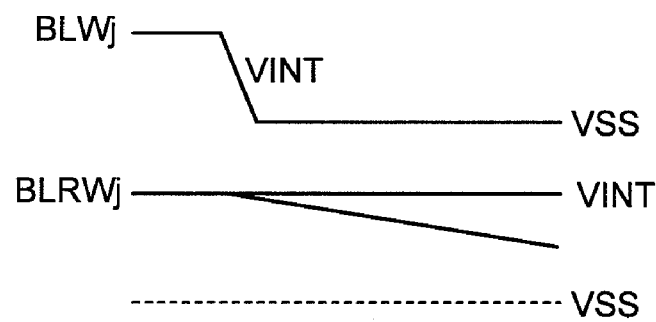
FIG. 14 is a diagram of operation waveforms of a semiconductor storage device according to an eleventh embodiment of the present invention.

FIG. 14 is a diagram of operation waveforms of a semiconductor storage device according to an eleventh embodiment of the present invention.

In FIG. 14, the potential of the bit line BLRWj shown in FIG. 1 is fixed to the low level and the potential of the bit line BLWj is set to floating after being set to the high level during readout. Then, when the transistor Q12 is on, the potential of the bit line BLRWj is set from the high level to the low level. When the transistor Q12 is off, the potential of the bit line BLRWj maintains the high level. Therefore, readout of 0 and 1 data can be performed. In this way, it is possible to freely change the polarities of the potentials of the bit lines BLWj and BLRWj.

Figure 15:
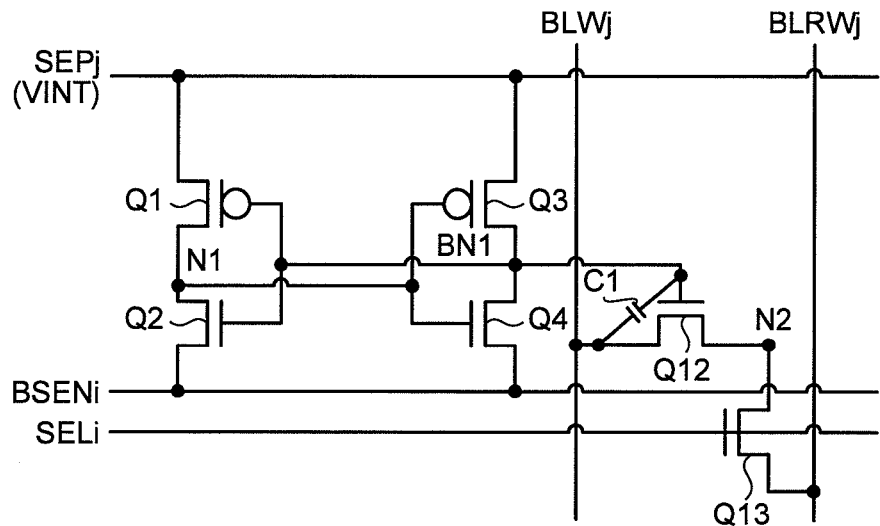
FIG. 15 is an equivalent circuit diagram of a schematic configuration of a semiconductor storage device according to a twelfth embodiment of the present invention.

FIG. 15 is an equivalent circuit diagram of a schematic configuration of a semiconductor storage device according to a twelfth embodiment of the present invention.

Figure 18A:
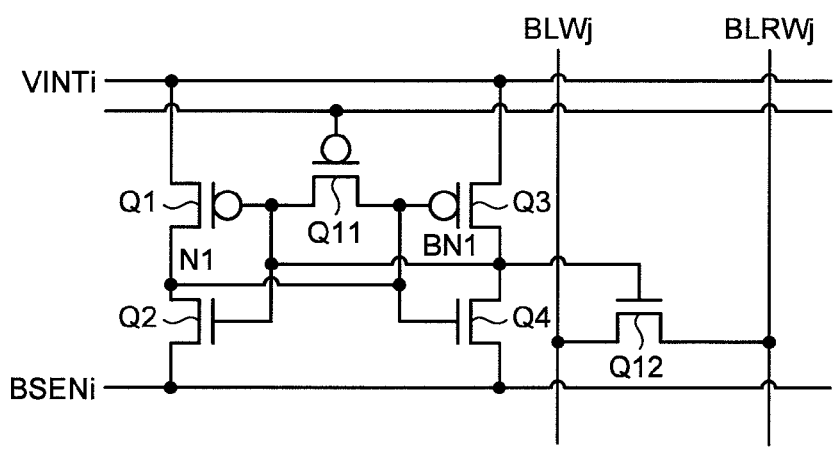
FIG. 18A is an equivalent circuit diagram of a schematic configuration of a semiconductor storage device according to a fifteenth embodiment of the present invention.
Figure 18B:
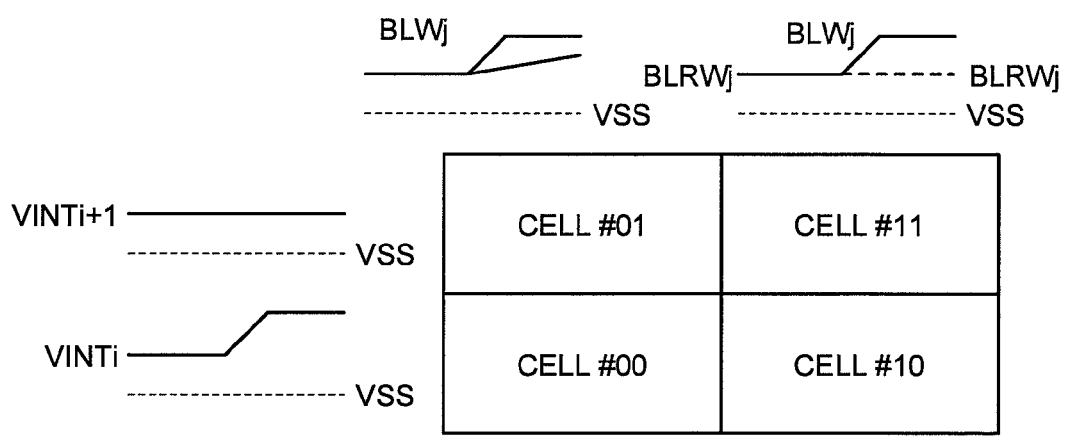
FIG. 18B is a diagram of waveforms of the potentials of a power supply lines VINT and a bit line BLWj of cells.

In FIG. 15, in the semiconductor storage device, the PMOS transistor Q11 is omitted from the configuration shown in FIG. 9. A power supply line SEPi is provided as the power supply line VINT. Consequently, the memory cell can be realized by six cell transistors and the cell size can be further reduced. As shown in FIGS. 18A to 18C, the NMOS transistor Q13 can also be omitted. In this case, the memory cell can be formed by five transistors.

The PMOS transistor Q11 is provided to equalize the nodes BN1 and N1. When the size of the NMOS transistor Q12 is increased or a large additional Cap for a DRAM or the like is used and the capacity of the capacitor C1 occupies most of the entire capacity of the node BN1, the potential of the power supply line BSENi is raised from the potential of the power supply line VSS to the potential of the power supply line VINT and the PMOS transistors Q1 and Q3 and the NMOS transistors Q2 and Q4 are turned off. Then, even if the nodes BN1 and N1 are not equalized by large coupling capacitance, the potential of the power supply line BSENi can be lowered to the potential of the power supply line VSS and the power supply line BSENi correctly operate in sensing the cell internal nodes.

Consequently, it is possible to reduce the number of elements to that of the normal SRAM while realizing a stable operation and a low-voltage operation. For example, after timing tw2 in FIG. 4, a potential difference between the nodes BN1 and N1 is reduced to about a half of the potential of the power supply line VINT. When the capacity of the capacitor C1 is large, a correct potential difference can be secured by coupling.

Figure 16A:
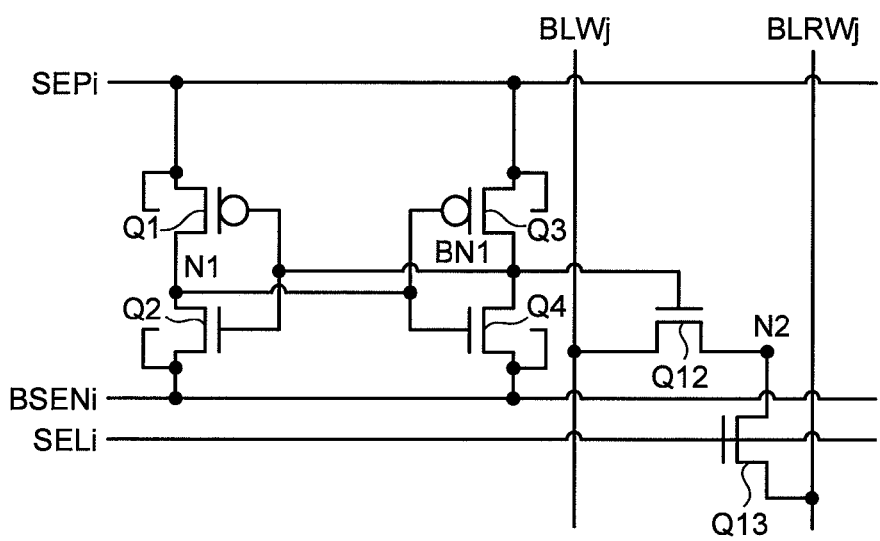
FIG. 16A is an equivalent circuit diagram of a schematic configuration of a semiconductor storage device according to a thirteenth embodiment of the present invention.

FIG. 16A is an equivalent circuit diagram of a schematic configuration of a semiconductor storage device according to a thirteenth embodiment of the present invention.

In FIG. 16A, in the semiconductor storage device, the PMOS transistor Q11 is omitted from the configuration shown in FIG. 1. The power supply line SEPi is provided instead of the power supply line VINT. If capacitance cannot be secured much between the node BN1 and the bit line BLWj, when the potential of the power supply line BSENi is raised from the potential of the power supply line VSS to the potential of the power supply line VINT, the potentials of P wells PWELL of the NMOS transistors Q2 and Q4 are simultaneously raised.

Figure 16B:
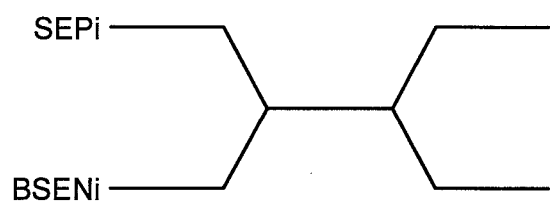
FIG. 16B is a diagram of a waveform of the potential of a power supply line SEPi.

Alternatively, the potential of the power supply line SEPi connected to the sources of the PMOS transistors Q1 and Q3 and the potentials of N wells NWELL of the PMOS transistors Q1 and Q3 can also be lowered. It is also possible to, as shown in FIG. 16B, raise the potential of the P wells PWELL of the NMOS transistors Q2 and Q4 and lower the potential of the N wells NWELL of the PMOS transistors Q1 and Q3. In short, it is sufficient to shift well potentials, set PN junction between a cell node and a well node in a forward direction, and reduce a potential difference between the nodes BN1 and N1.

Figure 17:
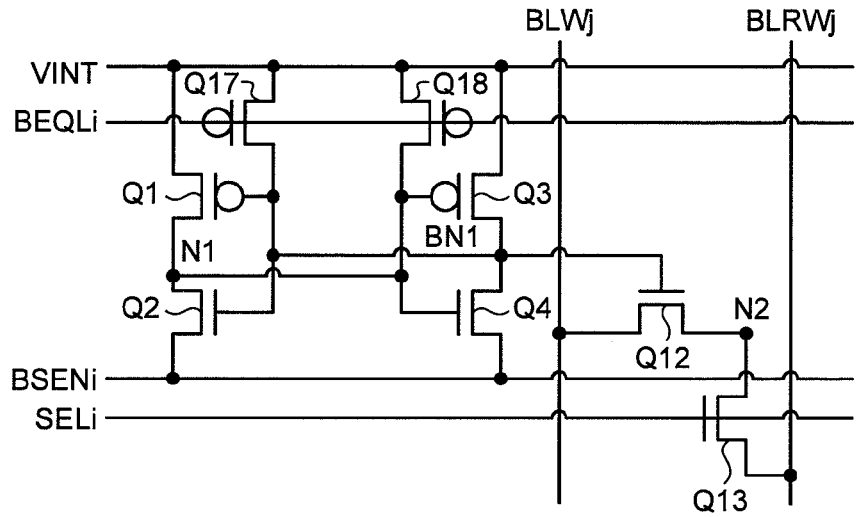
FIG. 17 is an equivalent circuit diagram of a schematic configuration of a semiconductor storage device according to a fourteenth embodiment of the present invention.

FIG. 17 is an equivalent circuit diagram of a schematic configuration of a semiconductor storage device according to a fourteenth embodiment of the present invention.

In FIG. 17, in the semiconductor storage device, PMOS transistors Q17 and Q18 are provided instead of the PMOS transistor Q11 shown in FIG. 1. The PMOS transistor Q17 is connected between the node BN1 and the power supply line VINT. The PMOS transistor Q18 is connected between the node N1 and the power supply line VINT. The equalize line BEQLi is connected to gates of the PMOS transistors Q17 and Q18.

In this case, after the potential of the power supply line BSENi is raised, if the potential of the equalize line BEQLi is set to the potential of the power supply line VSS irrespectively of a value of node potential on a low side of the nodes BN1 and N1, the nodes BN1 and N1 have the potential of the power supply line VINT. Therefore, it can be said that a safer operation can be performed.

FIG. 18A is an equivalent circuit diagram of a schematic configuration of a semiconductor storage device according to a fifteenth embodiment of the present invention.

In FIG. 18A, in the semiconductor storage device, the NMOS transistor Q13 and the row selection line SELi are omitted from the configuration shown in FIG. 1. When the NMOS transistor Q13 is not provided, the NMOS transistor Q12 is turned on when the node BN1 is at the high level and electric current flows to between the bit lines BLWj and BLRWj. Therefore, as shown in FIG. 18B, if a power supply of a selected row is raised to be equal to or higher than the potential of the power supply line VINT and the potentials of the bit lines BLWj and BLRWj are raised to potential higher than that of the power supply line VSS, only the NMOS transistor Q12 connected to the selected row can be turned on and elements can be reduced. Therefore, high integration can be performed. If not only the NMOS transistor Q13 but also the PMOS transistor Q11 is omitted from the configuration shown in FIG. 1, the memory cell can be realized by five cell transistors.

Figure 19:
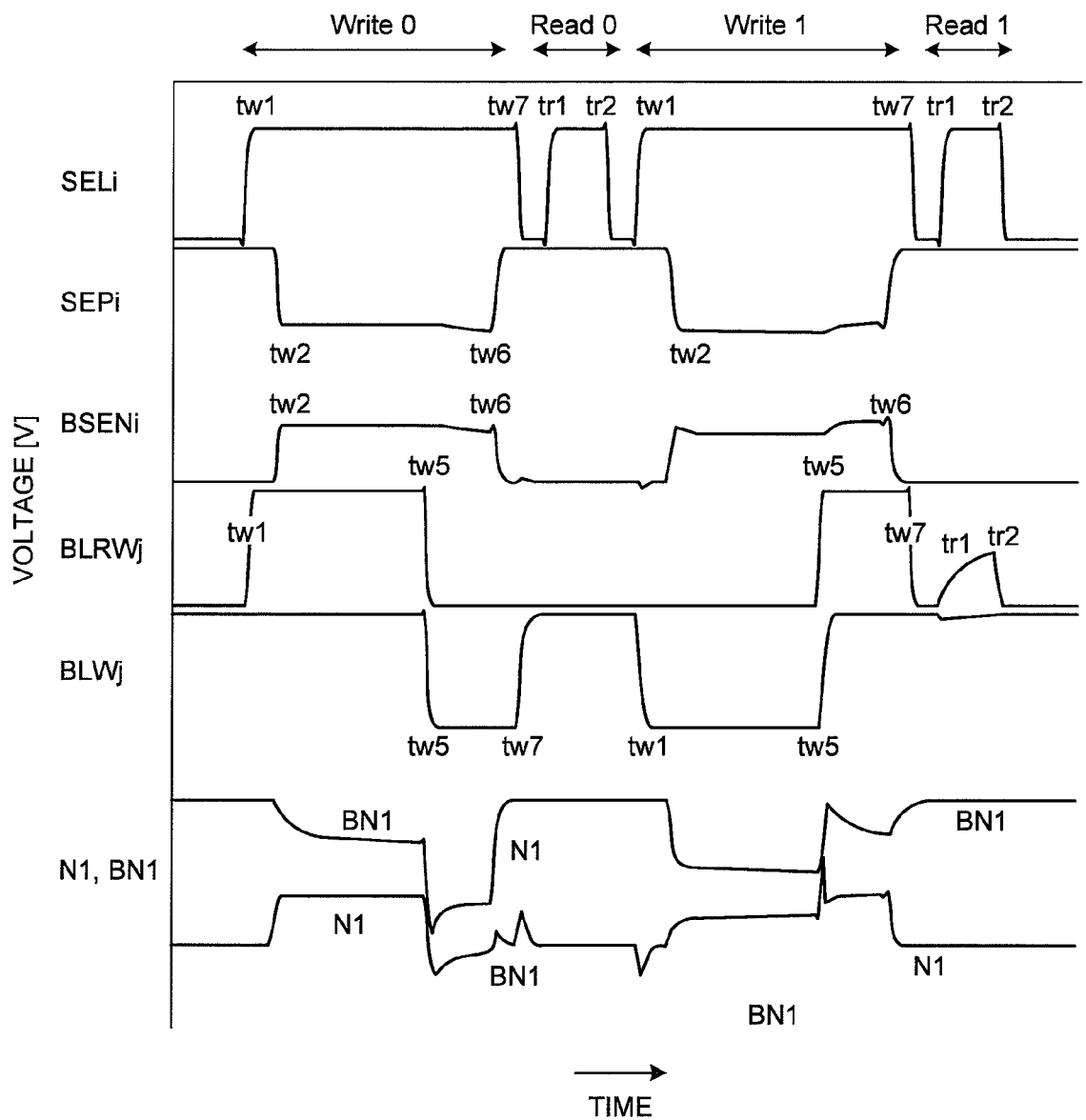
FIG. 19 is a timing chart of operation waveforms of a semiconductor storage device according to a sixteenth embodiment of the present invention.

FIG. 19 is a timing chart of operation waveforms of a semiconductor storage device according to a sixteenth embodiment of the present invention.

In FIG. 19, this embodiment is particularly suitable for the configuration shown in FIG. 15. A stable operation can be performed without a circuit for equalizing the nodes N1 and BN1. This embodiment is different from the embodiment shown in FIG. 4 in that there is no signal of the equalize line BEQLi and that Cap used in a large DRAM or the like is introduced into the capacitor C1. Other operations, effects, and the like are the same as those in the embodiment shown in FIG. 4. During the writing operation, at timing tw2, the potential of the power supply line SEPi shown in FIG. 15 is lowered and the potential of the power supply line BSENi is raised, whereby a potential difference between the nodes N1 and BN1 is reduced while the nodes N1 and BN1 are set to floating.

Thereafter, at timing tw5, both the potentials of the bit lines BLRWj and BLWj are set from the low level to the high level and from the high level to the low level, the potential difference between the nodes BN1 and N1 can be shifted to a desired polarity by large coupling of the capacitor C1. Thereafter, at timing tw6, the potential of the power supply line SEPi is raised, the potential of the power supply line BSENi is lowered, land the potentials of the nodes BN1 and N1 are amplified to desired voltage.

In this operation example, to prevent noise of the nodes BN1 and N1 from being increased by the capacitor C1 in operations other than the writing operation, during standby, the potential of the bit line BLRWj is set to the potential of the power supply line VSS and the potential of the bit line BLWj is set to the potential of the power supply line VINT. Further, transition of the potentials of the bit lines BLRWj and BLWj is minimized to prevent the potentials from being simultaneously transitioned to the high level and the low level. This makes it possible to suppress power consumption due to the transition while reducing unnecessary noise due to the capacitor C1. The concept of this operation can be applied to the circuits shown in FIGS. 16A, 20, and 21.

Figure 20:
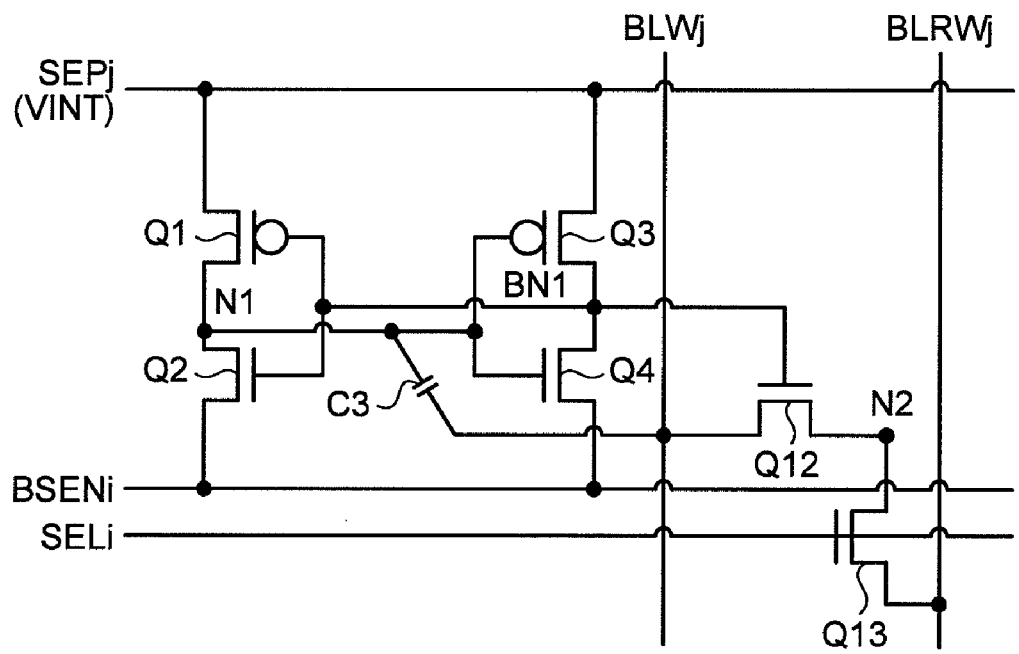
FIG. 20 is an equivalent circuit diagram of a schematic configuration of a semiconductor storage device according to a seventeenth embodiment of the present invention.

FIG. 20 is an equivalent circuit diagram of a schematic configuration of a semiconductor storage device according to a seventeenth embodiment of the present invention.

In FIG. 20, a capacitor C3 is provided instead of the capacitor C1 shown in FIG. 15. The capacitor C3 is connected between the node BN1 and the bit line BLWj.

In the embodiment shown in FIG. 15, the capacitor C1 is coupled to the node BN1. However, in the embodiment shown in FIG. 20, the capacitor C3 is coupled to the node N1. Actually, substantial coupling of the capacitor C3 decreases by an amount of coupling of the NMOS transistor Q12. However, a coupling amount of the capacitor C3 only has to be increased compared with the coupling of the NMOS transistor Q12. This configuration is desirably applied when a cell area is smaller on a layout if a capacitor is coupled to the node N1.

Figure 21:
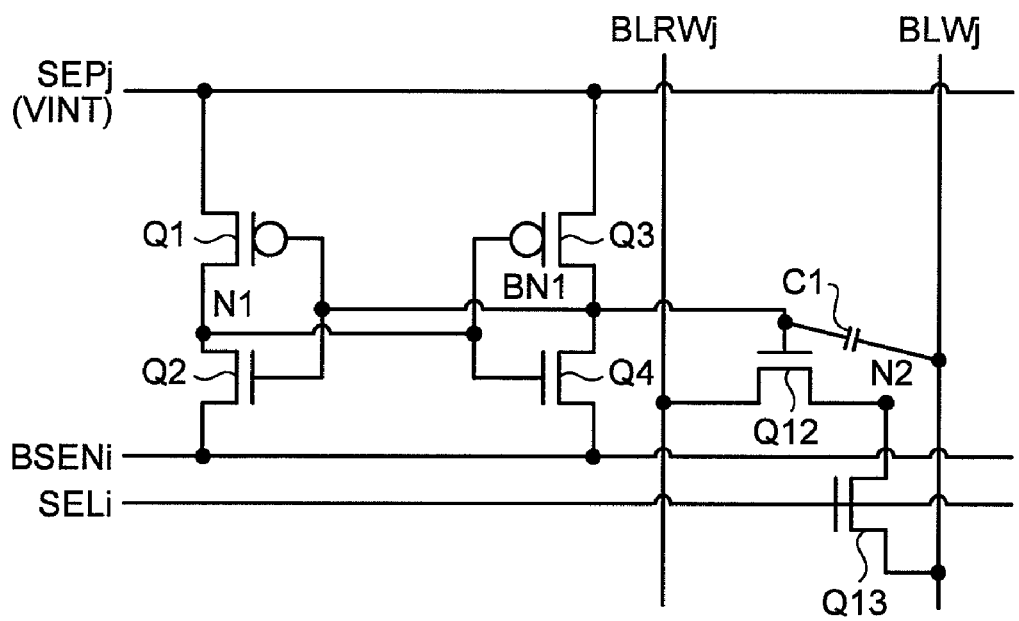
FIG. 21 is an equivalent circuit diagram of a schematic configuration of a semiconductor storage device according to an eighteenth embodiment of the present invention.

FIG. 21 is an equivalent circuit diagram of a schematic configuration of a semiconductor storage device according to an eighteenth embodiment of the present invention.

In FIG. 21, in the semiconductor storage device, a positional relation between the NMOS transistors Q12 and Q13 is opposite to that of the configuration shown in FIG. 15. The transistor Q13 is inserted between the node N2 and the bit line BLWj. As shown in FIG. 14, functions of the bit lines BLWj and BLRj are interchangeable. Therefore, no problem occurs even if the positional relation between the NMOS transistors Q12 and Q13 is opposite. This configuration is desirably applied when a cell area is smaller on a layout if a capacitor is coupled to the node N1.

FIGS. 22A to 22C and FIGS. 23A to 23C are plan views of a layout configuration of a semiconductor storage device according to a nineteenth embodiment of the present invention.

Figure 22C:
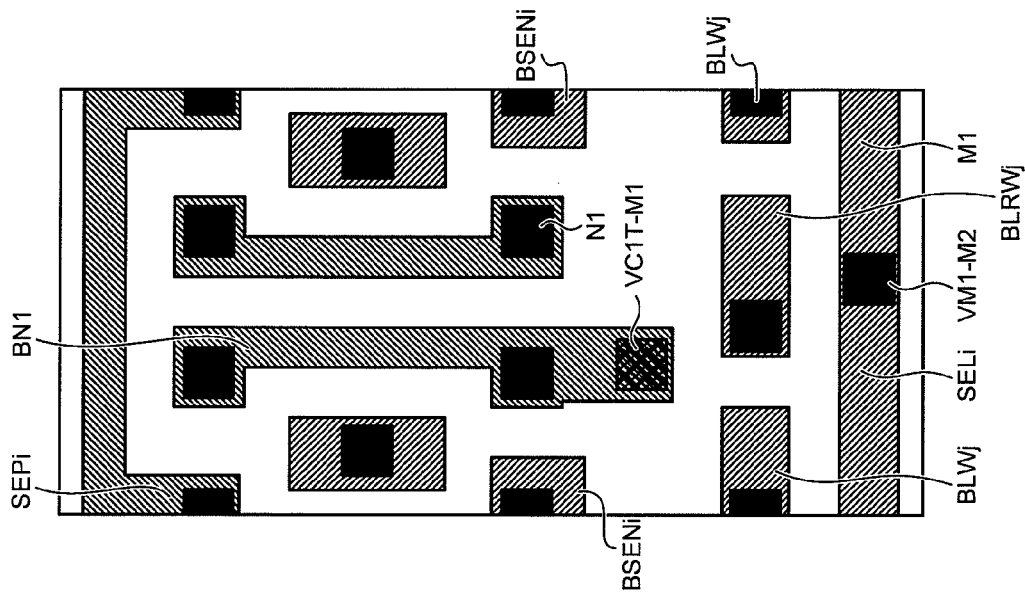
FIGS. 22A to 22C are plan views of a layout configuration of a semiconductor storage device according to a nineteenth embodiment of the present invention.
Figure 22B:
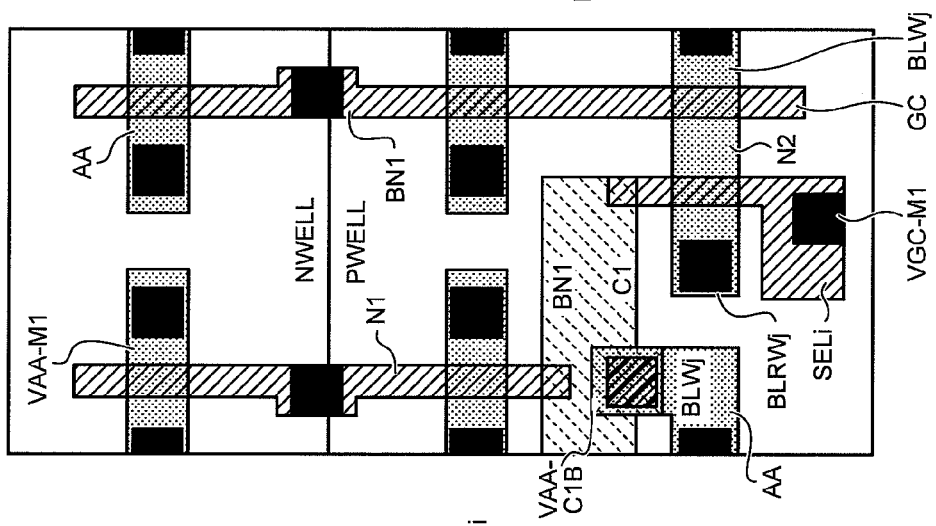
Figure 22A:
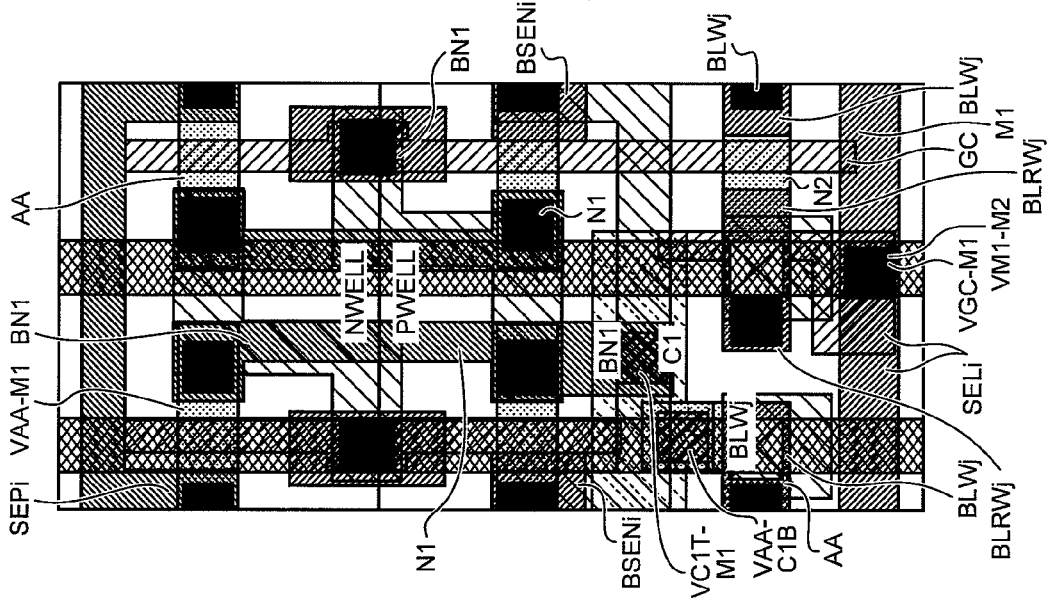
Figure 23C:
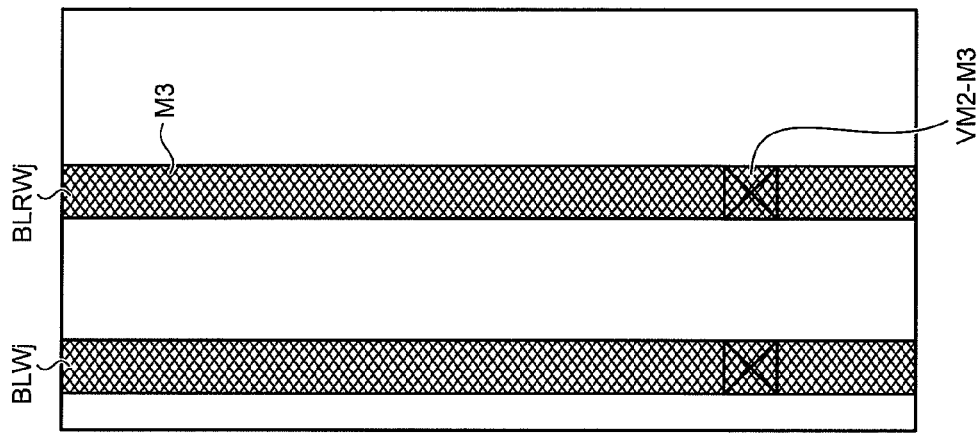
FIGS. 23A to 23C are plan views of a layout configuration of the semiconductor storage device according to the nineteenth embodiment of the present invention.
Figure 23B:
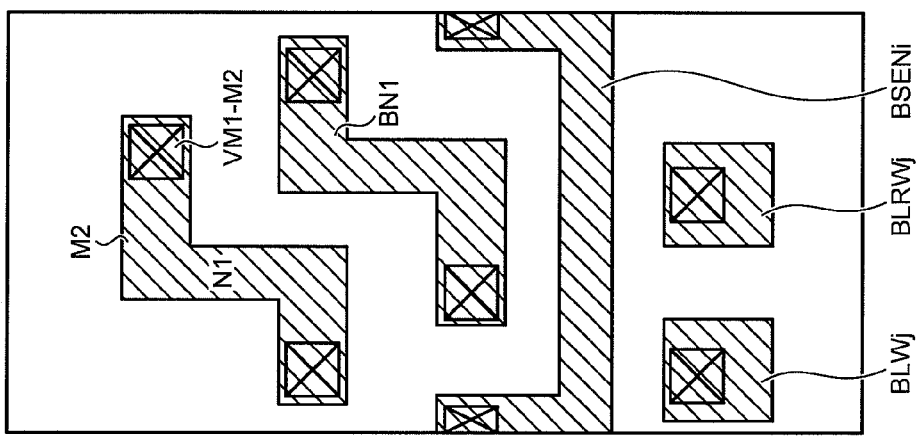
Figure 23A:
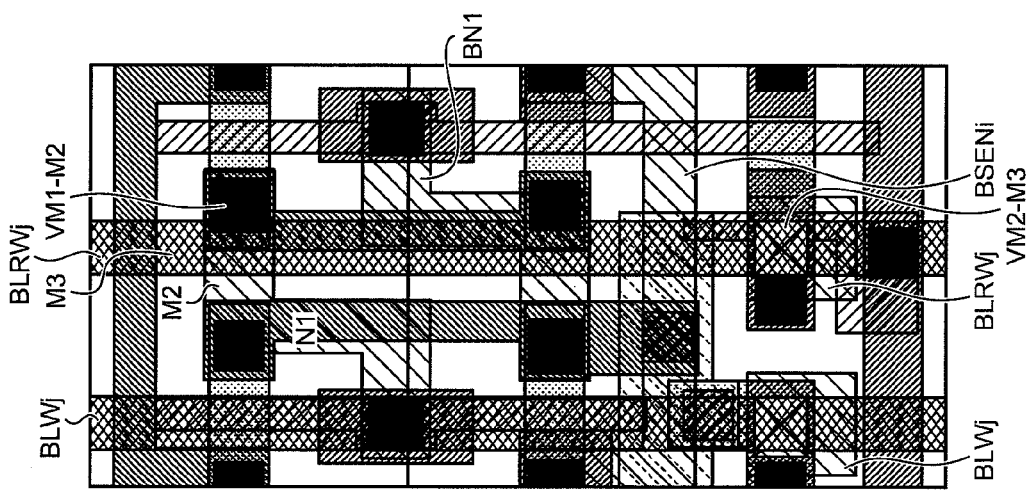

In FIGS. 22A to 22C and FIGS. 23A to 23C, this embodiment is suitable for a layout for realizing the equivalent circuit shown in FIG. 15. However, the embodiment can be applied to other examples in which the capacitor C1 is introduced. FIGS. 22A and 23A are the same figures. All layout layers are shown while being superimposed one on top of another.

In FIG. 22B, the diffusing layer AA, the gate wiring layer GC, the N well NWELL, the P well PWELL, the contact VAA-M1 between the diffusing layer AA and the metal wire M1, and the contact VGC-M1 between the gate wiring layer GC and the metal wire M1 are shown. Further, an upper part, a lower part, and an insulating film of the capacitor C1 are shown and a lower inter-electrode contact VAA-C1B between the diffusing layer AA and Cap is shown.

In FIG. 22C, the metal wire M1 and the contact VM1-M2 between the metal wires M1 and M2 are shown. Further, a contact VC1T-M1 between an upper electrode of Cap and the metal wire M1 is shown.

In FIG. 23B, the metal wire M2 and the contact VM1-M2 between the metal wires M1 and M2 are shown. In FIG. 23C, the metal wire M3 and the contact VM2-M3 between the metal wires M2 and M3 are shown.

FIGS. 24A to 24C and FIGS. 25A to 25C are plan views of a layout configuration of a semiconductor storage device according to a twentieth embodiment of the present invention.

Figure 24A:
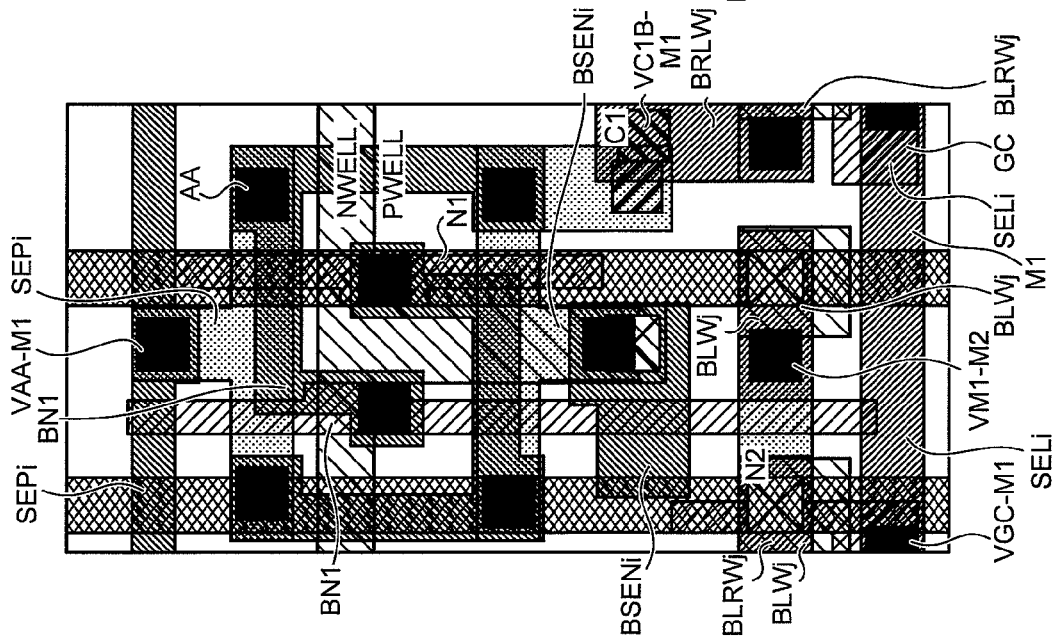
FIGS. 24A to 24C are plan views of a layout configuration of a semiconductor storage device according to a twentieth embodiment of the present invention.
Figure 24B:
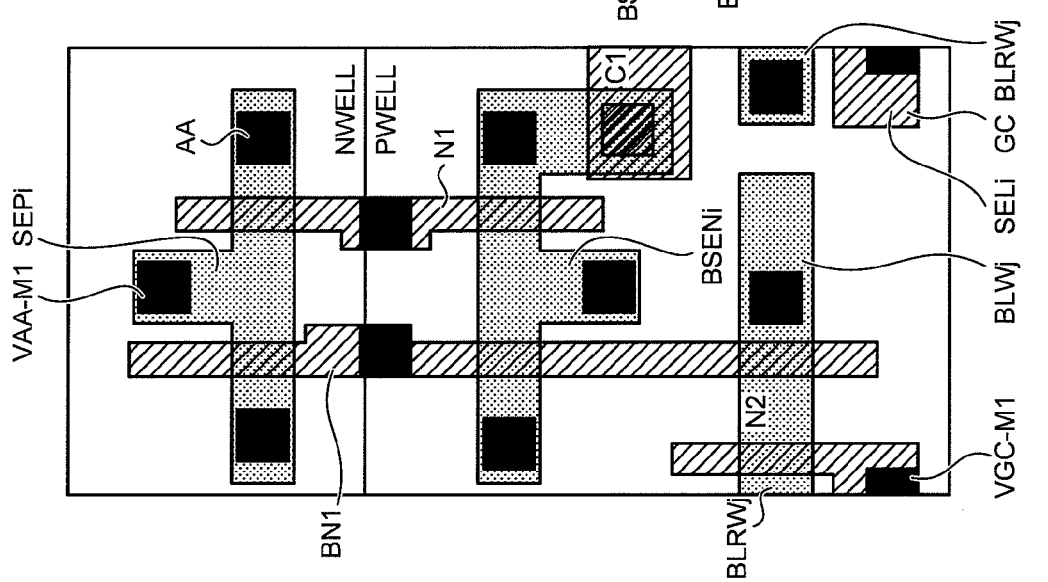
Figure 24C:
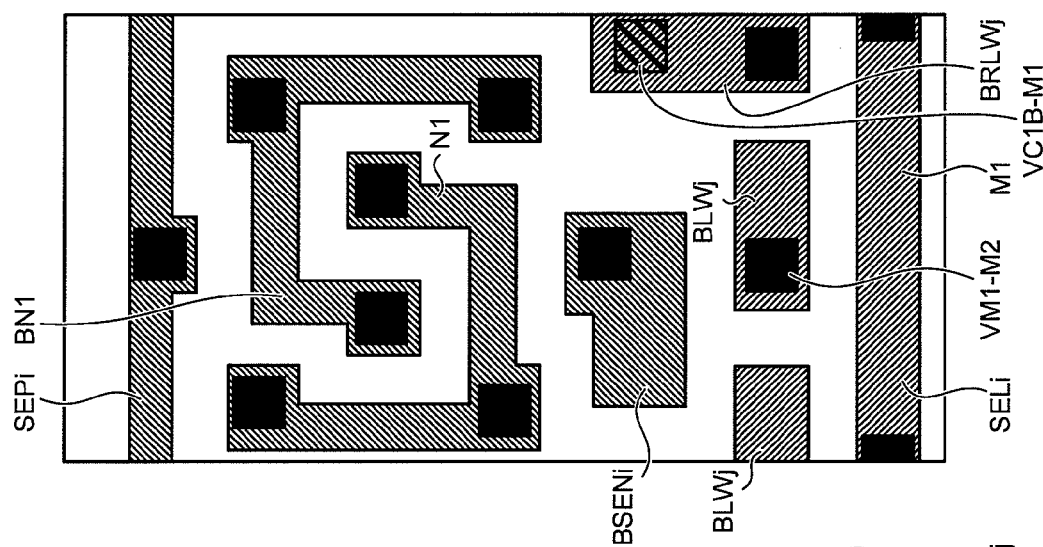

In FIGS. 24A to 24C and FIGS. 25A to 25C, this embodiment is suitable for a layout for realizing the equivalent circuit shown in FIG. 21. However, the embodiment can be applied to other examples in which the capacitor C1 is introduced. FIGS. 24A and 25A are the same figure. All layout layers are shown while being superimposed one on top of another. Layers shown in FIGS. 24B and 24C are respectively the same as those shown in FIGS. 22B and 22C. Layers shown in FIGS. 25B and 25C are respectively the same as those shown in FIGS. 23B and 23C. Therefore, the capacitor C1 can be easily formed in a memory cell of an SRAM.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising a memory cell configured to store 1-bit information, the memory cell comprising a first p-channel metal-oxide-semiconductor (PMOS) transistor, a second PMOS transistor, a first n-channel metal-oxide-semiconductor (NMOS) transistor, a second NMOS transistor, a first transistor, a second transistor, and a third transistor, wherein
    sources of the first and second PMOS transistors are connected to a first power supply line,
    a drain of the first PMOS transistor is connected to a first node,
    a drain of the second PMOS transistor is connected to a second node,
    sources of the first and second NMOS transistors are connected to a second power supply line,
    a drain of the first NMOS transistor is connected to the first node,
    a drain of the second NMOS transistor is connected to the second node,
    the first node is connected to a gate of the second PMOS transistor and a gate of the second NMOS transistor,
    the second node is connected to a gate of the first PMOS transistor and a gate of the first NMOS transistor,
    a gate of the first transistor is connected to a first signal line, a source of the first transistor is connected to the first node, and a drain of the first transistor is connected to the second node,
    a gate of the second transistor is connected to the second node, a source of the second transistor is connected to a third node, and a drain of the second transistor is connected to a second signal line, and
    a gate of the third transistor is connected to a third signal line, a source of the third transistor is connected to a fourth signal line, and a drain of the third transistor is connected to the third node.

2. The semiconductor storage device of claim 1, wherein the first transistor is a PMOS transistor and the second and third transistors are NMOS transistors.

3. The semiconductor storage device of claim 1, wherein the first, second, and third transistors are NMOS transistors.

4. The semiconductor storage device of claim 1, wherein the first transistor is an NMOS transistor and the second and third transistors are PMOS transistors.

5. The semiconductor storage device of claim 1, wherein, during writing, after the first transistor is turned on to set the first and second node to same potential, the first transistor is turned off to set the first and second node to a floating potential and potentials of the second and fourth signal lines are simultaneously transitioned.

6. The semiconductor storage device of claim 1, wherein capacitance equal to or larger than 20% of entire capacitance of the second node is added between the second node and the second signal line.

7. The semiconductor storage device of claim 1, wherein capacitance is added between the second node and the third node.

8. The semiconductor storage device of claim 1, wherein capacitance is added between the first node and the second signal line.

9. The semiconductor storage device of claim 1, wherein the first transistor and the first signal line are omitted.

10. The semiconductor storage device of claim 9, wherein, during writing, when potential of the second power supply line is raised to turn off the first PMOS transistor, the second PMOS transistor, the first NMOS transistor, and the second NMOS transistor, well potentials of the first NMOS transistor and the second NMOS transistor are raised.

11. The semiconductor storage device of claim 9, wherein, during writing, when potential of the second power supply line is raised to turn off the first PMOS transistor, the second PMOS transistor, the first NMOS transistor, and the second NMOS transistor, well potentials of the first PMOS transistor and the second PMOS transistor are lowered.

12. The semiconductor storage device of claim 1, wherein the third transistor and the third signal line are omitted and the third node is connected to the fourth signal line.

13. The semiconductor storage device of claim 10, when the second transistor connected to a selected row is turned on, potential of the first power supply line in the selected row is set larger than potential of the first power supply line in the deselected row.

14. The semiconductor storage device of claim 1, wherein a gate wire of the second transistor is thickened to the fourth signal line side on a diffusing layer of the second transistor.

15. The semiconductor storage device of claim 1, wherein a gate wire of the second node is thickened to the second signal line side on a diffusing layer.

16. The semiconductor storage device of claim 1, wherein, before the first transistor is turned on, potential of the first signal line is deflected further to negative than potential of the first power supply line.

17. The semiconductor storage device of claim 1, wherein the third transistor is inserted between the third node and the second signal line.

18. The semiconductor storage device of claim 1, wherein the third transistor is between the third node and the first signal line.

19. A semiconductor storage device comprising a memory cell configured to store 1-bit information, the memory cell comprising a circuit comprising at least a first PMOS transistor, a second PMOS transistor, a first NMOS transistor, and a second NMOS transistor, wherein
  sources of the first and second PMOS transistors are connected to a first power supply line,
  a drain of the first PMOS transistor is connected to a first node,
  a drain of the second PMOS transistor is connected to a second node,
  sources of the first and second NMOS transistors are connected to a second power supply line,
  a drain of the first NMOS transistor is connected to the first node,
  a drain of the second NMOS transistor is connected to the second node,
  the first node is connected to a gate of the second PMOS transistor and a gate of the second NMOS transistor,
  the second node is connected to a gate of the first PMOS transistor, a gate of the first NMOS transistor, and a first electrode of a capacitor,
  a second electrode of the capacitor is connected to a third node, and
  writing of 1-bit information of the memory cell is performed by changing potential of the third node and performing capacitance coupling of the capacitor.

20. The semiconductor storage device of claim 19, wherein capacitance of the capacitor comprises capacitance of the transistors.

21. A semiconductor storage device comprising a memory cell configured to store 1-bit information, the memory cell comprising a first p-channel metal-oxide-semiconductor (PMOS) transistor, a second PMOS transistor, a first n-channel metal-oxide-semiconductor (NMOS) transistor, a second NMOS transistor, a first transistor, a second transistor, a third transistor, and a fourth transistor, wherein
  sources of the first and second PMOS transistors are connected to a first power supply line,
  a drain of the first PMOS transistor is connected to a first node,
  a drain of the second PMOS transistor is connected to a second node,
  sources of the first and second NMOS transistors are connected to a second power supply line,
  a drain of the first NMOS transistor is connected to the first node,
  a drain of the second NMOS transistor is connected to the second node,
  the first node is connected to a gate of the second PMOS transistor and a gate of the second NMOS transistor,
  the second node is connected to a gate of the first PMOS transistor and a gate of the first NMOS transistor,
  a gate of the first transistor is connected to a first signal line, a source of the first transistor is connected to the first node,
  a gate of the fourth transistor is connected to the first signal line, a source of the fourth transistor is connected to the second node, and a drain of the first transistor and a drain of the fourth transistor are connected to a common power supply line,
  a gate of the second transistor is connected to the second node, a source of the second transistor is connected to a third node, and a drain of the second transistor is connected to a second signal line, and
  a gate of the third transistor is connected to a third signal line, a source of the third transistor is connected to a fourth signal line, and a drain of the third transistor is connected to the third node.

22. The semiconductor storage device of claim 21, wherein the third transistor and the third signal line are omitted and the third node is connected to the fourth signal line.

* * * * *